(12) United States Patent  
Takahashi

(10) Patent No.: US 9,537,478 B2  
(45) Date of Patent: Jan. 3, 2017

(54) SEMICONDUCTOR DEVICE

(71) Applicant: Semiconductor Energy Laboratory Co., Ltd., Kanagawa-ken (JP)

(72) Inventor: Kei Takahashi, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 111 days.

(21) Appl. No.: 14/638,377

(22) Filed: Mar. 4, 2015

(65) Prior Publication Data

US 2015/0263723 A1    Sep. 17, 2015

(30) Foreign Application Priority Data

Mar. 6, 2014 (JP) ................... 2014-043759

(51) Int. Cl.
| | | |
|---|---|---|
| H03B 1/00 | (2006.01) | |
| H03K 3/00 | (2006.01) | |
| H03K 17/56 | (2006.01) | |
| H01L 29/786 | (2006.01) | |
| H01L 29/24 | (2006.01) | |
| H01L 29/16 | (2006.01) | |

(Continued)

(52) U.S. Cl.
CPC .......... H03K 17/56 (2013.01); H01L 21/8258 (2013.01); H01L 27/0688 (2013.01); H01L 27/092 (2013.01); H01L 27/1255 (2013.01); H01L 29/16 (2013.01); H01L 29/24 (2013.01); H01L 29/7869 (2013.01)

(58) Field of Classification Search
USPC ................................. 327/108–112
See application file for complete search history.

(56) References Cited

U.S. PATENT DOCUMENTS 4,288,862 A * 9/1981 Ohhinata ............... G11C 11/39
327/193
4,963,756 A * 10/1990 Quan ................. G06K 7/10851
235/462.27

(Continued)

FOREIGN PATENT DOCUMENTS

EP    1737044 A    12/2006
EP    2226847 A     9/2010

(Continued)

OTHER PUBLICATIONS

Stevens, J. "Using a Single-Output Gate-Driver for High-Side or Low-Side Drive," Texas Instruments Application Report SLUa669, Mar. 2013, Texas Instruments.

(Continued)

*Primary Examiner* — Adam Houston
(74) *Attorney, Agent, or Firm* — Husch Blackwell LLP

(57) ABSTRACT

A semiconductor device or the like capable of preventing malfunction of a driver circuit is provided. In a driver circuit for driving a power device used for current supply, a transistor including an oxide semiconductor is used as a transistor in a circuit (specifically, for example, a level shift circuit) requiring a high withstand voltage. In addition, a transistor (for example, a silicon transistor or the like) capable of higher operation than a transistor including an oxide semiconductor is preferably used as a transistor in a circuit (specifically, for example, a buffer circuit, a flip-flop circuit, or the like) requiring a lower withstand voltage than the level shift circuit.

6 Claims, 12 Drawing Sheets

US 9,537,478 B2

Page 2

(51) Int. Cl.
  *H01L 27/12* (2006.01)
  *H01L 21/8258* (2006.01)
  *H01L 27/06* (2006.01)
  *H01L 27/092* (2006.01)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,538,481 B1 | 3/2003 | Suetsugu |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,049,850 B2 | 5/2006 | Shimizu |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,199,617 B1 | 4/2007 | Schrom |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,443,202 B2 | 10/2008 | Kimura et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,663,404 B2 | 2/2010 | Kimura et al. |
| 7,674,650 B2 | 3/2010 | Akimoto et al. |
| 7,732,819 B2 | 6/2010 | Akimoto et al. |
| 7,961,006 B2 | 6/2011 | Kimura et al. |
| 8,471,596 B2 | 6/2013 | Kimura et al. |
| 8,854,104 B2 | 10/2014 | Chung et al. |
| 9,024,675 B2 * | 5/2015 | Sul .................. H03K 19/01850 326/68 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 * | 6/2006 | Abe .................... H01L 29/7869 257/197 |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0085389 A1 * | 4/2011 | Khellah ................ G11O 5/145 365/189.11 |
| 2011/0101942 A1 | 5/2011 | Yamazaki et al. |
| 2011/0157216 A1 * | 6/2011 | Yamazaki ......... G02F 1/133553 345/596 |
| 2011/0164026 A1 * | 7/2011 | Wu ........................ H02M 3/07 345/214 |
| 2012/0294096 A1 | 11/2012 | Nishijima |
| 2013/0163350 A1 | 6/2013 | Ohshima |
| 2014/0002140 A1 * | 1/2014 | Wang .................. H03K 17/063 327/108 |
| 2014/0009189 A1 * | 1/2014 | Mauder ................ H03K 17/687 327/109 |
| 2014/0049293 A1 * | 2/2014 | Mallikarjunaswamy H01L 21/8221 327/108 |
| 2014/0333365 A1 * | 11/2014 | Takahashi ......... H03K 3/356017 327/333 |
| 2014/0333598 A1 * | 11/2014 | Shi ...................... G09G 3/3473 345/212 |
| 2015/0055051 A1 * | 2/2015 | Osawa ................ H01L 27/1225 349/48 |
| 2015/0263723 A1 * | 9/2015 | Takahashi .............. H03K 17/56 327/108 |
| 2016/0036315 A1 * | 2/2016 | Ohashi .................... H02M 1/08 327/109 |
| 2016/0172010 A1 * | 6/2016 | Kato ........................ G11O 5/10 365/72 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |

(56) References Cited

FOREIGN PATENT DOCUMENTS

| | | |
|---|---|---|
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-079131 A | 3/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-328329 A | 11/2004 |
| JP | 10152930 B4 * | 6/2007 ............ H02M 7/538 |
| WO | WO-2004/114391 | 12/2004 |

OTHER PUBLICATIONS

"HV Floating MOS-Gate Driver ICs," International Rectifier Application Note AN-978, Mar. 23, 2007, International Rectifer.
Asakuma.N. et al., "Crystallization and Reduction of Sol-Gel-Derived Zinc Oxide Films by Irradiation With Ultraviolet Lamp", Journal of Sol-Gel Science and Technology. 2003, vol. 26, pp. 181-184.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 365-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and SN-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using Castep", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2006, pp. 251-252, The Japan Society of Applied Physics.
Godo.H et al., "P-9:Numerical Analysis on Temperature Dependence of Characteristics of Amphorphous In—Ga—Zn—Oxide TFT", SID Digest '09 : SID International Symposium Digest of Technical Papers, May 31, 2008, pp. 1110-1112.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High 'Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SIG Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperature over 1000° C.", Journal of Solid State Chemistry, 1985, vol. 60, pp. 382-384.
Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

(56) References Cited

OTHER PUBLICATIONS

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett.(Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 16th International Display Workshops, Dec. 3, 2008, pp. 581-584.

Nakamura.M et al., The phase relations in the In2O3—Ga2ZnO4-ZnO system at 1350° C., Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGao3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 16, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '08 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '06 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-638.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 8th International Display Workshops, Dec. 4, 2002, pp. 295-298.

Ueno.K et al., "Field-Effect Transistor on SrTiO3 With Sputtered A12O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

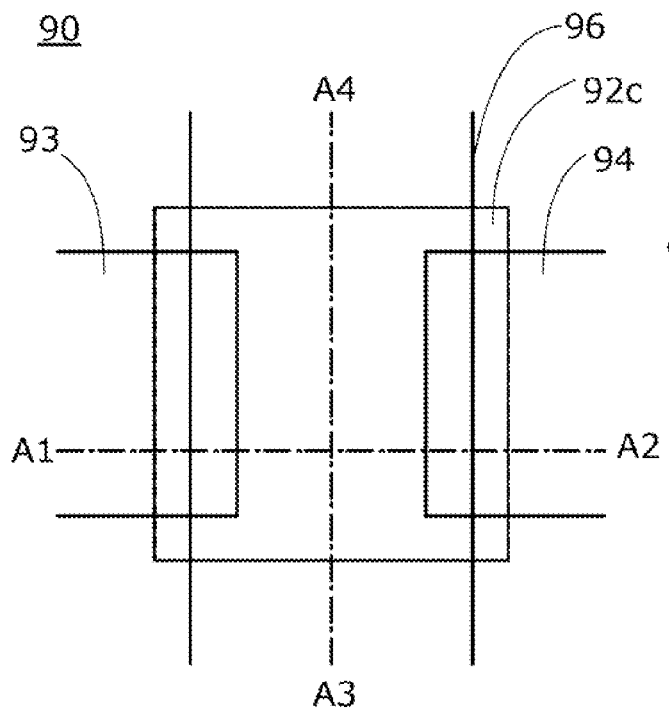
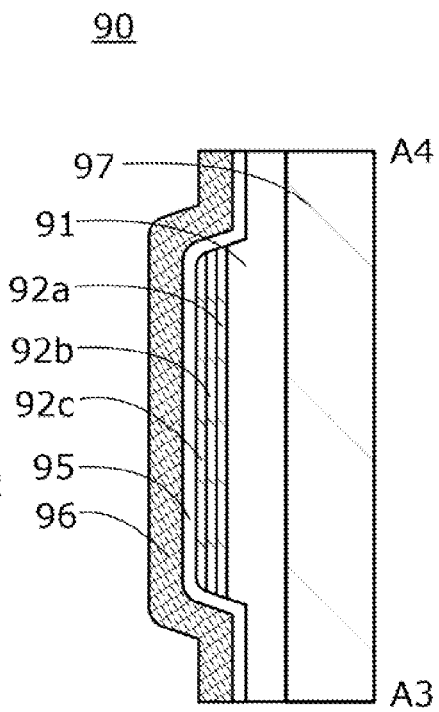
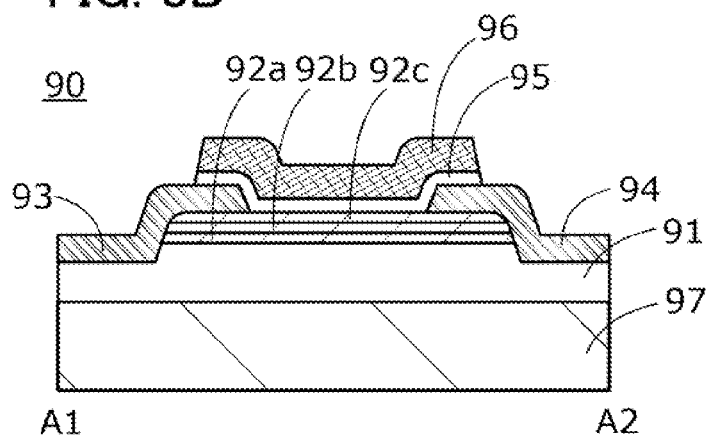

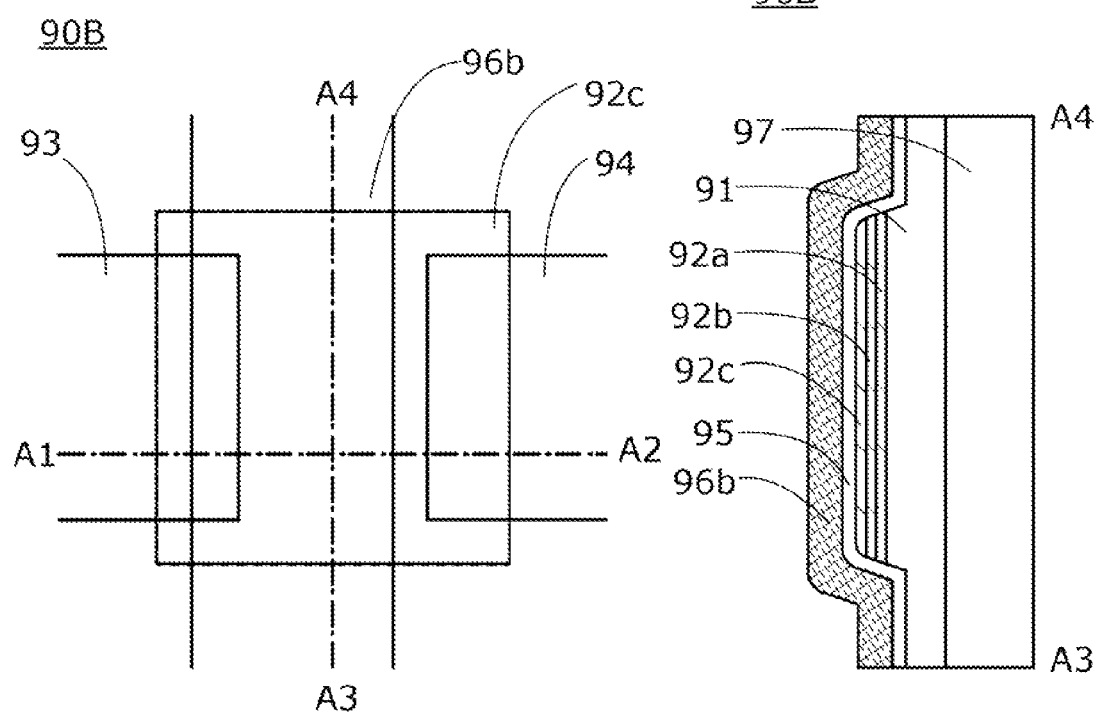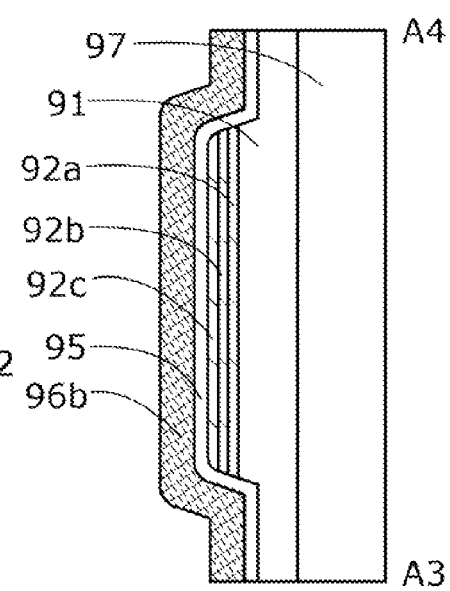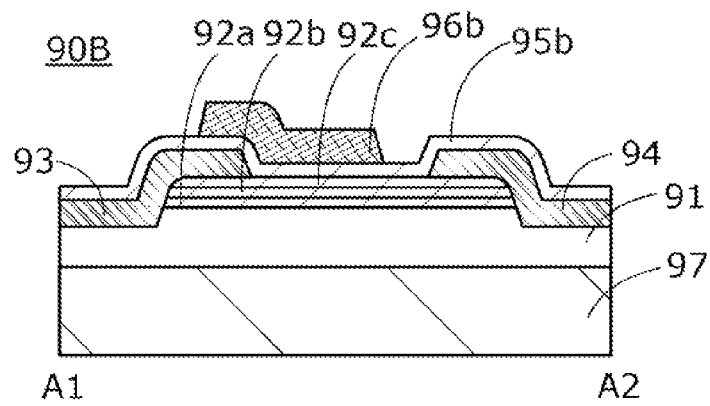

SEMICONDUCTOR DEVICE

BACKGROUND OF THE INVENTION

1. Field of the Invention

The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

A power device, which is typified by a power transistor such as an insulated gate bipolar transistor (IGBT), is an element that can be used for driving a load such as a motor. The power device performs switching operation so that a large current can be supplied to the load intermittently.

Driving of the power transistor is controlled by pulse width modulation (PWM). PWM control is performed in accordance with a PWM signal output from a microcomputer or the like provided outside. The voltage of the PWM signal is too low to directly drive the power transistor having a large gate capacitance. Therefore, the PWM signal needs to be converted into a high-voltage signal before supplied to the power transistor.

Patent Document 1 discloses a semiconductor device in which a transistor including silicon in a channel formation region is used in a driver circuit for converting a PWM signal into a high-voltage signal.

PRIOR ART DOCUMENT

Patent Document

[Patent Document 1] Japanese Published Patent Application No. 2003-079131

SUMMARY OF THE INVENTION

In the driver circuit for converting a PWM signal into a high-voltage signal, a high voltage is used for signal conversion. Hence, a transistor disposed in an area of the driver circuit to which a high voltage is applied needs to have a high withstand voltage. However, a transistor including silicon in a channel formation region (hereinafter, also simply referred to as a silicon transistor) has a relatively low withstand voltage and therefore might undergo dielectric breakdown when being used in that area. The transistor breakdown leads to malfunction of the driver circuit including the transistor.

Thus, an object of one embodiment of the present invention is to provide a semiconductor device or the like capable of preventing malfunction of a driver circuit. Another object of one embodiment of the present invention is to provide a semiconductor device or the like including a high withstand voltage transistor. Still another object of one embodiment of the present invention is to provide a semiconductor device or the like having a novel structure.

Note that the objects of one embodiment of the present invention are not limited to the above. The objects described above do not disturb the existence of other objects. The other objects are objects that are not described above and will be described below. The objects that are not described above will be apparent from and can be derived from the description of the specification, the drawings, and the like by those skilled in the art. Note that one embodiment of the present invention is to achieve at least one of the above objects and/or the other objects.

One embodiment of the present invention is a semiconductor device in which a transistor including an oxide semiconductor is used as a transistor in a circuit (specifically, for example, a level shift circuit) requiring a high withstand voltage in a driver circuit for driving a power device used for current supply. In addition, in the driver circuit of one embodiment of the present invention, a transistor (for example, a silicon transistor or the like) capable of higher operation than a transistor including an oxide semiconductor is preferably used as a transistor in a circuit (specifically, for example, a buffer circuit, a flip-flop circuit, or the like) requiring a lower withstand voltage than the level shift circuit.

A more specific structure of one embodiment of the present invention can be, for example, as follows.

One embodiment of the present invention is a semiconductor device including a first circuit, a second circuit, a third circuit, and a fourth circuit. The first circuit has a function of converting a first signal into a second signal and outputting the second signal; the second circuit has a function of converting the second signal into a third signal and outputting the third signal; the third circuit has a function of outputting a fourth signal based on the third signal; and the fourth circuit has a function of outputting a first potential or a second potential in accordance with the fourth signal. The second circuit includes a first transistor, a second transistor, a first resistor, and a second resistor. One of a source and a drain of the first transistor is electrically connected to one terminal of the first resistor; one of a source and a drain of the second transistor is electrically connected to one terminal of the second resistor; a channel of the first transistor includes an oxide semiconductor; and a channel of the second transistor includes an oxide semiconductor.

Another embodiment of the present invention is a semiconductor device including a first circuit, a second circuit, a third circuit, and a fourth circuit. The first circuit has a function of converting a first signal into a second signal and outputting the second signal; the second circuit has a function of converting the second signal into a third signal and outputting the third signal; the third circuit has a function of outputting a fourth signal based on the third signal; and the fourth circuit has a function of outputting a first potential or a second potential in accordance with the fourth signal. The second circuit includes a first transistor, a second transistor, a first resistor, and a second resistor. The fourth circuit includes a third transistor and a fourth transistor. One of a source and a drain of the first transistor is electrically connected to one terminal of the first resistor; one of a source and a drain of the second transistor is electrically connected to one terminal of the second resistor; the other terminal of the first resistor is electrically connected to a first wiring; the other terminal of the second resistor is electrically connected to the first wiring; a gate of the third transistor is electrically connected to the third circuit; one of a source and a drain of the third transistor is electrically connected to one of a source and a drain of the fourth transistor; the other of the source and the drain of the third transistor is electrically connected to the first wiring; a gate of the fourth transistor is electrically connected to the third circuit; the other of the source and the drain of the fourth transistor is electrically connected to a second wiring; a channel of the first transistor includes an oxide semiconductor; a channel of the second transistor includes an oxide semiconductor; a channel of the third transistor includes silicon; and a channel of the fourth transistor includes silicon.

In the above semiconductor device, it is preferable that an insulating film be positioned over the third transistor and the fourth transistor, and the first transistor and the second transistor be positioned over the insulating film.

Also in the above semiconductor device, it is preferable that the second signal have a higher potential than the first signal, and the third signal have a higher potential than the second signal.

Furthermore, the above semiconductor device may include a fifth circuit that has a function of converting the fourth signal into a fifth signal having a higher potential than the fourth signal and outputting the fifth signal to the fourth circuit.

Also in the above semiconductor device, it is preferable that the channel of the first transistor include indium, gallium, and zinc, and the channel of the second transistor include indium, gallium, and zinc.

Note that other embodiments of the present invention will be described in the following embodiments and the drawings.

According to one embodiment of the present invention, a semiconductor device or the like capable of preventing malfunction of a driver circuit can be provided. According to another embodiment of the present invention, a semiconductor device or the like including a high withstand voltage transistor can be provided. According to still another embodiment of the present invention, a semiconductor device or the like having a novel structure can be provided.

Note that the effects of one embodiment of the present invention are not limited to the above. The effects described above do not disturb the existence of other effects. Note that the other effects are effects that are not described above and will be described below. The effects that are not described above will be apparent from and can be derived from the description of the specification, the drawings, and the like by those skilled in the art. One embodiment of the present invention is to have at least one of the above effects and/or the other effects. Accordingly, one embodiment of the present invention does not have the above effects in some cases.

BRIEF DESCRIPTION OF THE DRAWINGS

FIGS. 8A to 8C show diagrams illustrating a structure example of a transistor of one embodiment of the present invention.

FIGS. 9A to 9C show diagrams illustrating a structure example of a transistor of one embodiment of the present invention.

DETAILED DESCRIPTION OF THE INVENTION

Figure 1:
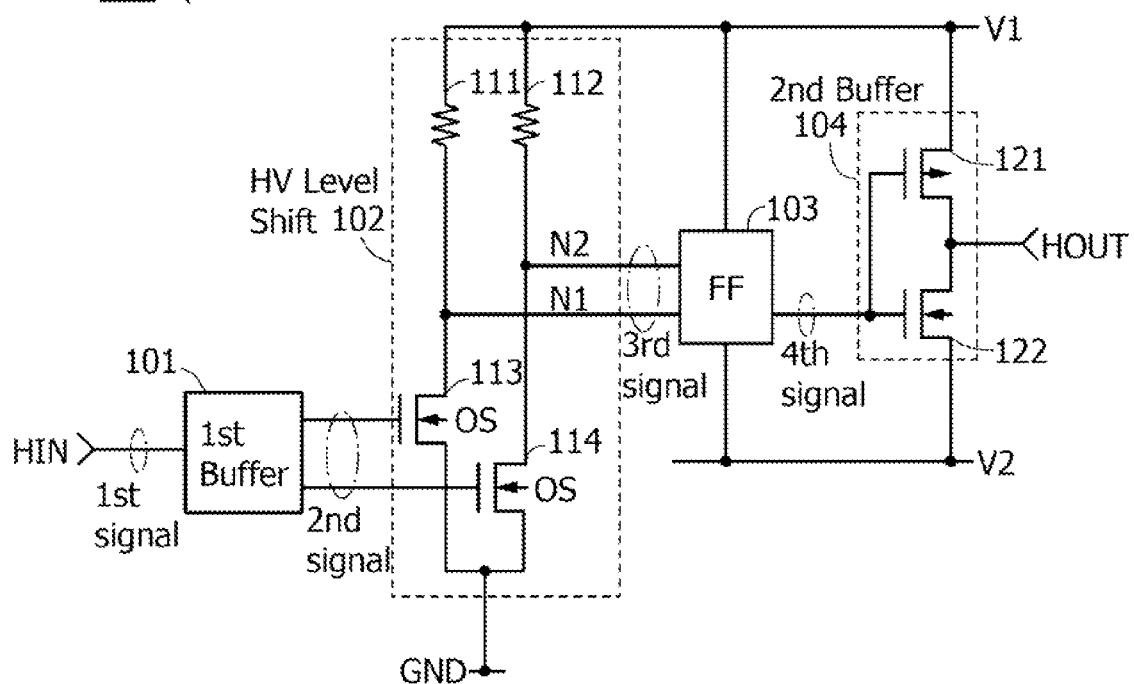
FIG. 1 shows a circuit diagram illustrating one embodiment of the present invention.

Embodiments will be described below with reference to the drawings. Note that the embodiments can be implemented with various modes and it is easily understood by those skilled in the art that the mode and details can be variously changed without departing from the scope and spirit of the present invention. Therefore, the present invention should not be construed as being limited to the description in the following embodiments.

In the drawings, the size, the layer thickness, or the region is exaggerated for clarity in some cases. Therefore, the embodiments of the present invention are not limited to such a scale. Note that the drawings are schematic views showing ideal examples, and the embodiments are not limited to shapes or values shown in the drawings. For example, the following can be included: variation in signal, voltage, or current due to noise or variation in signal, voltage, or current due to difference in timing.

In this specification and the like, a transistor is an element having at least three terminals: a gate, a drain, and a source. The transistor includes a channel region between the drain (a drain terminal, a drain region, or a drain electrode) and the source (a source terminal, a source region, or a source electrode) and current can flow through the drain, the channel region, and the source.

Here, since the source and the drain of the transistor change depending on the structure, the operating condition, and the like of the transistor, it is difficult to define which is a source or a drain. Thus, a portion that functions as the source and a portion that functions as the drain are not called a source and a drain, and one of the source and the drain is referred to as a first electrode and the other thereof is referred to as a second electrode in some cases.

Note that ordinal numbers such as "first", "second", and "third" in this specification are used in order to avoid confusion among components, and the terms do not limit the components numerically.

Note that in this specification, the phrase "A and B are connected" means the case where A and B are electrically connected to each other as well as the case where A and B are directly connected to each other. Here, the phrase "A and B are electrically connected" means the following case: when an object having any electrical function exists between A and B, an electric signal can be transmitted and received between A and B.

Note that, for example, in the case where a source (or a first terminal or the like) of a transistor is electrically connected to X through (or not through) Z1 and a drain (or a second terminal or the like) of the transistor is electrically connected to Y through (or not through) Z2, or in the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, any of the following expressions can be employed.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, each of X, Y, Z1, and Z2 denotes an object (e.g., a device, an element, a circuit, a wiring, an electrode, a terminal, a conductive film, a layer, or the like).

Note that in this specification, terms for describing arrangement, such as "over" and "under", are used for convenience for describing the positional relationship between components with reference to drawings. Furthermore, the positional relationship between components is changed as appropriate in accordance with a direction in which each component is described. Thus, the positional relationship is not limited to that described with a term used in this specification and can be explained with another term as appropriate depending on the situation.

Note that the positional relationships of circuit blocks in block diagrams are specified for description, and even in the case where different circuit blocks have different functions in the diagrams, the different circuit blocks might be provided in an actual circuit block so that different functions are achieved in the same circuit block. The functions of circuit blocks in drawings are specified for description, and even in the case where one circuit block is illustrated, blocks might be provided in an actual circuit block so that processing performed by one circuit block is performed by a plurality of circuit blocks.

In this specification, voltage often refers to a difference between a given potential and a reference potential (e.g., a GND potential). Accordingly, voltage, potential, and potential difference can also be referred to as potential, voltage, and voltage difference, respectively. Note that voltage refers to a difference between potentials of two points, and potential refers to electrostatic energy (electric potential energy) of a unit charge at a given point in an electrostatic field.

In this specification, the term "parallel" indicates that the angle formed between two straight lines ranges from −10° to 10°, and accordingly also includes the case where the angle ranges from −5° to 5°. The term "substantially parallel" indicates that the angle formed between two straight lines is greater than or equal to −30° and less than or equal to 30°. The term "perpendicular" indicates that the angle formed between two straight lines ranges from 80° to 100°, and accordingly also includes the case where the angle ranges from 85° to 95°. The term "substantially perpendicular" indicates that the angle formed between two straight lines is greater than or equal to 60° and less than or equal to 120°.

In this specification, the trigonal and rhombohedral crystal systems are included in the hexagonal crystal system.

Note that in this specification and the like, a semiconductor device refers to a circuit including a semiconductor element (e.g., a transistor, a diode, or the like), and a device including the circuit. The semiconductor device also means any device that can function by utilizing semiconductor characteristics. For example, an integrated circuit, a chip including an integrated circuit, a display device, a light-emitting device, a lighting device, and an electronic device are all semiconductor devices.

Embodiment 1

In this embodiment, circuit structures and operation of a semiconductor device will be described with reference to FIG. 1 to FIG. 4.

FIG. 1 is a diagram illustrating an example of a circuit structure of the semiconductor device. FIG. 1 shows a circuit for controlling the drive of a higher potential power device of two power devices (not illustrated) connected in series between a high potential main power source and a low potential main power source. A semiconductor device 100 illustrated in FIG. 1 includes a buffer circuit 101 (denoted as 1st Buffer in FIG. 1) as a first circuit, a level shift circuit 102 (denoted as HV Level Shift in FIG. 1) as a second circuit, a flip-flop circuit 103 (denoted as FF in FIG. 1) as a third circuit, and a buffer circuit 104 (denoted as 2nd Buffer in FIG. 1) as a fourth circuit.

Each circuit included in the semiconductor device 100 will be described below.

<Buffer Circuit 101>

The buffer circuit 101 is a circuit having a function of boosting a signal (first signal), which is input to a terminal BIN from a microcomputer or the like, to a signal capable of operating the level shift circuit 102 and/or converting the first signal into a signal (second signal) with increased electric charge supply capability, and outputting the second signal. The first signal is a signal for alternately turning on a transistor 121 and a transistor 122 included in the buffer circuit 104, and is input to the buffer circuit 104 after being boosted in the buffer circuit 101 and the level shift circuit 102. In other words, the first signal is a signal for controlling the conduction or non-conduction of the higher potential power device (not illustrated) electrically connected to an output terminal HOUT, and has an "H (high potential)" for turning on the power device and an "L (low potential)" for turning off the power device.

One of the two output terminals of the buffer circuit 101 is electrically connected to a gate of a transistor 113 included in the level shift circuit 102, and the other is electrically connected to a gate of a transistor 114 included in the level shift circuit 102. The second signals output from the two output terminals of the buffer circuit 101 are preferably inverted from each other.

Note that in FIG. 1, the buffer circuit 101 is provided between the terminal HIN and the level shift circuit 102. Another buffer circuit may be added between the buffer circuit 101 and the level shift circuit 102.

<Level Shift Circuit 102>

The level shift circuit 102 is a circuit having a function of converting the second signal, which is output from the buffer circuit 101, into a third signal that is boosted to a voltage for driving the power device. In other words, the third signal is a signal obtained by shifting the level (potential) of the second signal to a high potential side. The potential of the second signal is higher than that of the first signal, and the potential of the third signal is higher than that of the second signal.

The level shift circuit 102 includes the transistor 113, the transistor 114, a resistor 111, and a resistor 112. One terminal of the resistor 111 is electrically connected to one of a source and a drain of the transistor 113, and one terminal of the resistor 112 is electrically connected to one of a source and a drain of the transistor 114. Further, the other of the source and the drain of the transistor 113 and the other of the source and the drain of the transistor 114 are electrically connected to a ground potential (GND). The other terminal of the resistor 111 and the other terminal of the resistor 112 are electrically connected to a wiring supplied with a voltage V1 for driving the power device.

The second signal input to the level shift circuit 102 is supplied to the gate of the transistor 113 and the gate of the transistor 114. In addition, a potential of a node N1 at which the one of the source and the drain of the transistor 113 is electrically connected to the one terminal of the resistor 111, and a potential of a node N2 at which the one of the source and the drain of the transistor 114 is electrically connected to the one terminal of the resistor 112, are output as third signals to input terminals of the flip-flop circuit 103. The potential of the wiring supplied with the voltage V1 is supplied to the node N1 or the node N2 through the resistor 111 or the resistor 112. Accordingly, the third signal can be obtained by boosting the level of the second signal to a high potential side.

Note that as mentioned above, the second signals output from the two output terminals of the buffer circuit 101 are preferably inverted from each other. In that case, the third signals output from the two output terminals of the level shift circuit 102 are also inverted from each other.

The transistor 113 and the transistor 114 included in the level shift circuit 102 are each a transistor including an oxide semiconductor as a semiconductor material, whose channel is formed in the oxide semiconductor. The oxide semiconductor has a wide band gap (typically, greater than or equal to approximately 3.0 eV and less than or equal to approximately 3.5 eV) and therefore has a high withstand voltage. Each of the transistor 113 and the transistor 114 includes an oxide semiconductor between the drain to which a high electric field is applied and the gate, which prevents a current from being generated between the drain and the gate. As a result, degradation or breakdown of the transistors can be inhibited. Furthermore, the oxide semiconductor has extremely few thermally excited carriers, so that a transistor including an oxide semiconductor can have high reliability without degradation of characteristics even in a high temperature environment. Hence, when a transistor including an oxide semiconductor is provided in the level shift circuit 102, malfunction of the semiconductor device 100 can be inhibited and a highly reliable semiconductor device capable of stable operation can be obtained.

Note that silicon carbide (SiC), gallium nitride (GaN), and the like are known as a semiconductor with a wider band gap than a silicon semiconductor, but a device including such a semiconductor cannot be manufactured with high productivity because process temperatures of them are higher than that of a silicon semiconductor. In contrast, an oxide semiconductor (preferably a metal oxide semiconductor) is advantageous in that a semiconductor with a band gap of 2.5 eV or more, preferably 3.0 eV or more can be easily formed by a sputtering method, a printing method, or the like, and the process temperature is low. Therefore, a highly reliable semiconductor device can be manufactured with high productivity.

Moreover, short-channel effects are known to occur due to a shortened channel length of a transistor including silicon, in which case the subthreshold swing (S value) deteriorates, or the threshold voltage shifts in the negative direction. In contrast, a transistor including an oxide semiconductor is an accumulation-type transistor whose majority carriers are electrons; therefore, drain-induced barrier lowering (DIBL) is less likely to occur than in an inversion-type transistor such as a silicon transistor. In other words, the transistor including an oxide semiconductor is unlikely to suffer the short-channel effects. Hence, by employing the transistor including an oxide semiconductor, high integration of transistors and/or miniaturization of a semiconductor device can be achieved while degradation of the electrical characteristics of the transistors due to miniaturization is suppressed.

Furthermore, when the resistor 111 and the resistor 112 included in the level shift circuit 102 include an oxide semiconductor as the transistor 113 and the transistor 114, the level shift circuit 102 can be manufactured in a more simplified process and a shorter time. This reduces the production costs of the semiconductor device.

<Flip-Flop Circuit 103>

The flip-flop circuit 103 is a circuit to which the third signal with a level shifted by the level shift circuit 102 is input and which has a function of outputting a fourth signal based on the third signal to the buffer circuit 104. The flip-flop circuit 103 is a set/reset flip-flop circuit and for example, set by a signal input to a terminal electrically connected to the transistor 113 and reset by a signal input to a terminal electrically connected to the transistor 114. In that case, for example, the "L (low potential)" is output from the flip-flop circuit 103 when the transistor 113 is on and the transistor 114 is off, whereas the "H (high potential)" is output from the flip-flop circuit 103 when the transistor 113 is off and the transistor 114 is on.

<Buffer Circuit 104>

The buffer circuit 104 is a circuit having a function of outputting a potential corresponding to the fourth signal output from the flip-flop circuit 103 to the power device (not illustrated) through the terminal HOUT. The buffer circuit 104 includes the transistor 121 and the transistor 122. A gate of the transistor 121 and a gate of the transistor 122 are electrically connected to the flip-flop circuit 103, and the conduction or non-conduction of the transistor 121 and the transistor 122 is controlled by the output from the flip-flop circuit 103. One of a source and a drain of the transistor 121 is electrically connected to the wiring supplied with the voltage V1 for driving the power device. The other of the source and the drain of the transistor 121 is electrically connected to one of a source and a drain of the transistor 122. The other of the source and the drain of the transistor 122 is electrically connected to a wiring supplied with a voltage V2 for driving the power device.

The voltage V1 is a voltage for turning on the power device connected to the terminal HOUT. The voltage V2 is a voltage for turning off the power device connected to the terminal HOUT. A voltage output from the terminal HOUT to control switching of the power device connected to the terminal HOUT is switched between the voltage V1 and the voltage V2 by the buffer circuit 104 and is output. Note that in some cases, the voltage V1 is referred to as a first potential and the voltage V2 is referred to as a second potential. Note that each of the voltage V1 and the voltage V2 is preferably a voltage generated by boosting a high power source potential VDD using a bootstrap circuit. Further, in the case where the high power source potential VDD is higher than the voltage V1 and the voltage V2, the voltage V1 and the voltage V2 may be a voltage generated by stepping down the high power source potential VDD. Note that the voltage V1 and the voltage V2 may be a voltage directly applied from the outside. Note that the voltage V1 is higher than the voltage V2.

Note that as mentioned above, the fourth signal supplied to the gates of the transistor 121 and the transistor 122 is originally supplied to the terminal HIN. The fourth signal alternately turns on the transistor 121 and the transistor 122. Accordingly, the voltage V1 and the voltage V2 are alternately output from the terminal HOUT.

Note that this embodiment shows an example in which the p-type transistor 121 and the n-type transistor 122 are used to constitute a CMOS circuit; however, one embodiment of the present invention is not limited thereto. For example, a buffer circuit may be constituted by using n-type or p-type transistors for both the transistor 121 and the transistor 122 and providing an inverter circuit in addition to the transistor 121 and the transistor 122.

There is no particular limitation on the semiconductor material used for the transistor 121 and the transistor 122. Note that in order to increase the driving speed of the circuit, it is preferable to use a transistor with a high switching rate, for example, a transistor using single crystal silicon or the like. Alternatively, in the case of a buffer circuit including the n-type transistor 121, the n-type transistor 122, and the inverter circuit, an oxide semiconductor may be used for the transistor 121 and the transistor 122. In that case, the manufacturing process or costs of the semiconductor device can be reduced.

Note that it is preferable to employ a structure in which the transistor 121 and the transistor 122 include silicon and the transistor 113 and the transistor 114 each including an oxide semiconductor are provided over the transistor 121 and the transistor 122 with an insulating film interposed therebetween. This structure results in a reduction in the area of the driver circuit and miniaturization of the semiconductor device.

Note that there is also no particular limitation on the semiconductor material used for the transistors included in the buffer circuit 101 and/or the flip-flop circuit 103 as in the buffer circuit 104. In order to increase the driving speed of the circuit, it is preferable to use a transistor with a high switching rate, for example, a transistor using single crystal silicon or the like. Alternatively, a transistor including an oxide semiconductor may be used to reduce the manufacturing process or costs of the semiconductor device. Note that for miniaturization of the semiconductor device, the transistors included in the level shift circuit 102 are preferably formed over the transistors included in the buffer circuit 101 and/or the flip-flop circuit 103 with an insulating film interposed therebetween.

In the aforementioned semiconductor device 100, a transistor whose channel is formed in an oxide semiconductor is used as the transistor 113 and the transistor 114 in the level shift circuit 102, so that dielectric breakdown of the transistor 113 and the transistor 114 can be inhibited. This enables the driver circuit for driving the power device to operate normally, and prevents malfunction. Furthermore, miniaturization of the transistors in the level shift circuit 102 can be achieved, reducing the size and costs of the semiconductor device 100.

Next, a specific example of a circuit structure of the buffer circuit 101 included in the semiconductor device 100 illustrated in FIG. 1 will be described with reference to FIG. 2. Note that in the semiconductor device of this embodiment, the structure of the buffer circuit 101 is not limited to that illustrated in FIG. 2.

Figure 2:
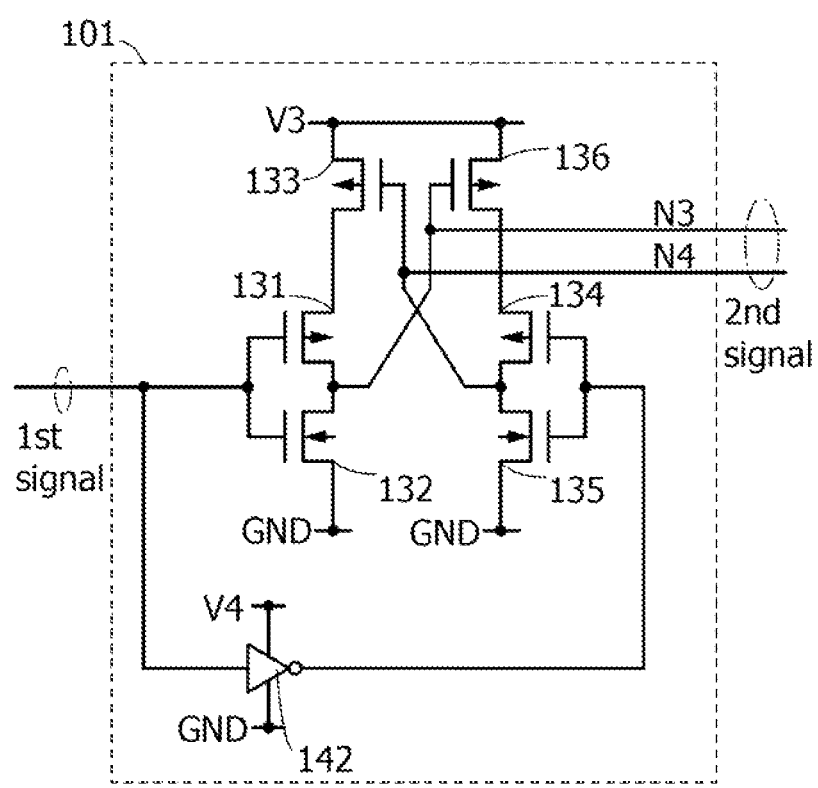
FIG. 2 shows a circuit diagram illustrating one embodiment of the present invention.

The buffer circuit 101 illustrated in FIG. 2 includes a transistor 131 to a transistor 136 and an inverter circuit 142, which serve as buffers of the first signal supplied to the terminal HIN.

In the buffer circuit 101 illustrated in FIG. 2, a power source potential is applied to the inverter circuit 142 by a wiring supplied with a voltage V4 and a wiring supplied with the ground potential (GND). Furthermore, the first signal is input to the inverter circuit 142 and a gate (a gate of the transistor 131 and a gate of the transistor 132) of a CMOS circuit in which the p-type transistor 131 is electrically connected to the n-type transistor 132. A signal inverted from the first signal is output from the inverter circuit 142 and input to a gate (a gate of the transistor 134 and a gate of the transistor 135) of a CMOS circuit in which the p-type transistor 134 is electrically connected to the n-type transistor 135.

One of a source and a drain of the transistor 132 is electrically connected to one of a source and a drain of the transistor 131, and the other of the source and the drain of the transistor 132 is electrically connected to the ground potential (GND). The other of the source and the drain of the transistor 131 is electrically connected to one of a source and a drain of the transistor 133, and the other of the source and the drain of the transistor 133 is electrically connected to a wiring supplied with a voltage V3. Similarly, one of a source and a drain of the transistor 135 is electrically connected to one of a source and a drain of the transistor 134, and the other of the source and the drain of the transistor 135 is electrically connected to the ground potential (GND). The other of the source and the drain of the transistor 134 is electrically connected to one of a source and a drain of the transistor 136, and the other of the source and the drain of the transistor 136 is electrically connected to the wiring supplied with the voltage V3.

Then, a potential of a node N3 at which the one of the source and the drain of the transistor 132, the one of the source and the drain of the transistor 131, and the gate of the transistor 136 are electrically connected, and a potential of a node N4 at which the one of the source and the drain of the transistor 134, the one of the source and the drain of the transistor 135, and the gate of the transistor 133 are electrically connected, are output as the second signal to the level shift circuit 102. In the structure illustrated in FIG. 2, the potential of the node N4 is inverted from the potential of the node N3.

Note that in the buffer circuit 101 illustrated in FIG. 2, the voltage V3 is higher than the voltage V4. For example, the high power source potential VDD is supplied as the voltage V3 and a low power source potential VSS is supplied as the voltage V4. The potential of the first signal is boosted to a predetermined potential (e.g., the high power source potential VDD) by the buffer circuit 101, and the second signal with the potential can be output to the level shift circuit 102.

Figure 3:
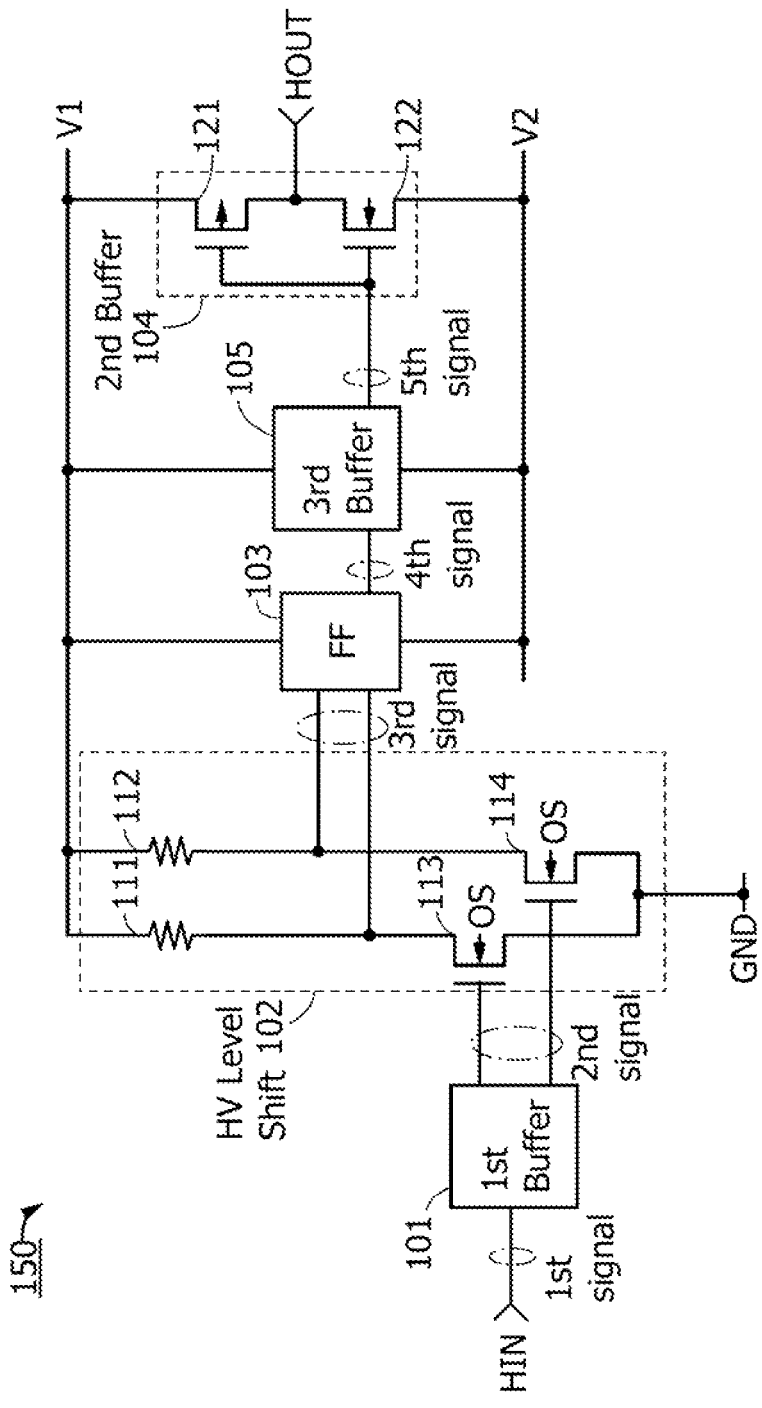
FIG. 3 shows a circuit diagram illustrating one embodiment of the present invention.

FIG. 3 illustrates another structure example of the semiconductor device of this embodiment. A semiconductor device 150 illustrated in FIG. 3, like the semiconductor device 100 illustrated in FIG. 1, is a circuit for controlling the drive of a higher potential power device. The semiconductor device 150 illustrated in FIG. 3 includes the buffer circuit 101 (denoted as 1st Buffer in FIG. 3) as a first circuit, the level shift circuit 102 (denoted as HV Level Shift in FIG. 3) as a second circuit, the flip-flop circuit 103 (denoted as FF in FIG. 3) as a third circuit, the buffer circuit 104 (denoted as 2nd Buffer in FIG. 3) as a fourth circuit, and a buffer circuit 105 (denoted as 3rd Buffer in FIG. 3) as a fifth circuit.

The semiconductor device 150 illustrated in FIG. 3 has a structure in which the buffer circuit 105 is additionally provided between the flip-flop circuit 103 and the buffer circuit 104 in the structure of the semiconductor device 100 illustrated in FIG. 1. The buffer circuit 101, the level shift circuit 102, the flip-flop circuit 103, and the buffer circuit 104 included in the semiconductor device 150 can have structures similar to those described above; thus, detailed description thereof is omitted.

The buffer circuit 105 is a circuit having a function of converting the fourth signal output from the flip-flop circuit 103 into a fifth signal and outputting the fifth signal to the buffer circuit 104. The buffer circuit 105 illustrated in FIG. 3 as well as the buffer circuit 104 is electrically connected to a wiring to which the voltage V1 is applied and a wiring to which the voltage V2 is applied. The buffer circuit 105 generates the fifth signal, which has a potential obtained by raising the potential of the fourth signal, in order to surely turning on the transistor 121 or the transistor 122 included in the buffer circuit 104. The third signal output through the transistor 113 and the transistor 114 is sometimes a signal with a voltage lowered by the threshold voltage of the transistor 113 and the transistor 114. In that case, the transistor 121 or the transistor 122 might not be turned on surely. Thus, the buffer circuit 105 is additionally provided between the flip-flop circuit 103 and the buffer circuit 104, so that the conductive state of the transistor in the buffer circuit 104 can be controlled accurately even in the case of occurrence of voltage drop by the threshold voltage of the transistor 113 and the transistor 114. This allows the semiconductor device to operate more stably.

Note that a specific structure of the buffer circuit 105 can be similar to, for example, that of the buffer circuit 104, though one embodiment of the present invention is not limited thereto.

There is no particular limitation on the semiconductor material used for the transistor included in the buffer circuit 105. Note that in order to increase the driving speed of the circuit, it is preferable to use a transistor with a high switching rate, for example, a transistor using single crystal silicon or the like. Alternatively, in the case where transistors with the same conductivity are used for the buffer circuit 105, an oxide semiconductor may be used as the semiconductor material. In that case, the manufacturing process or costs of the semiconductor device can be reduced.

Figure 12:
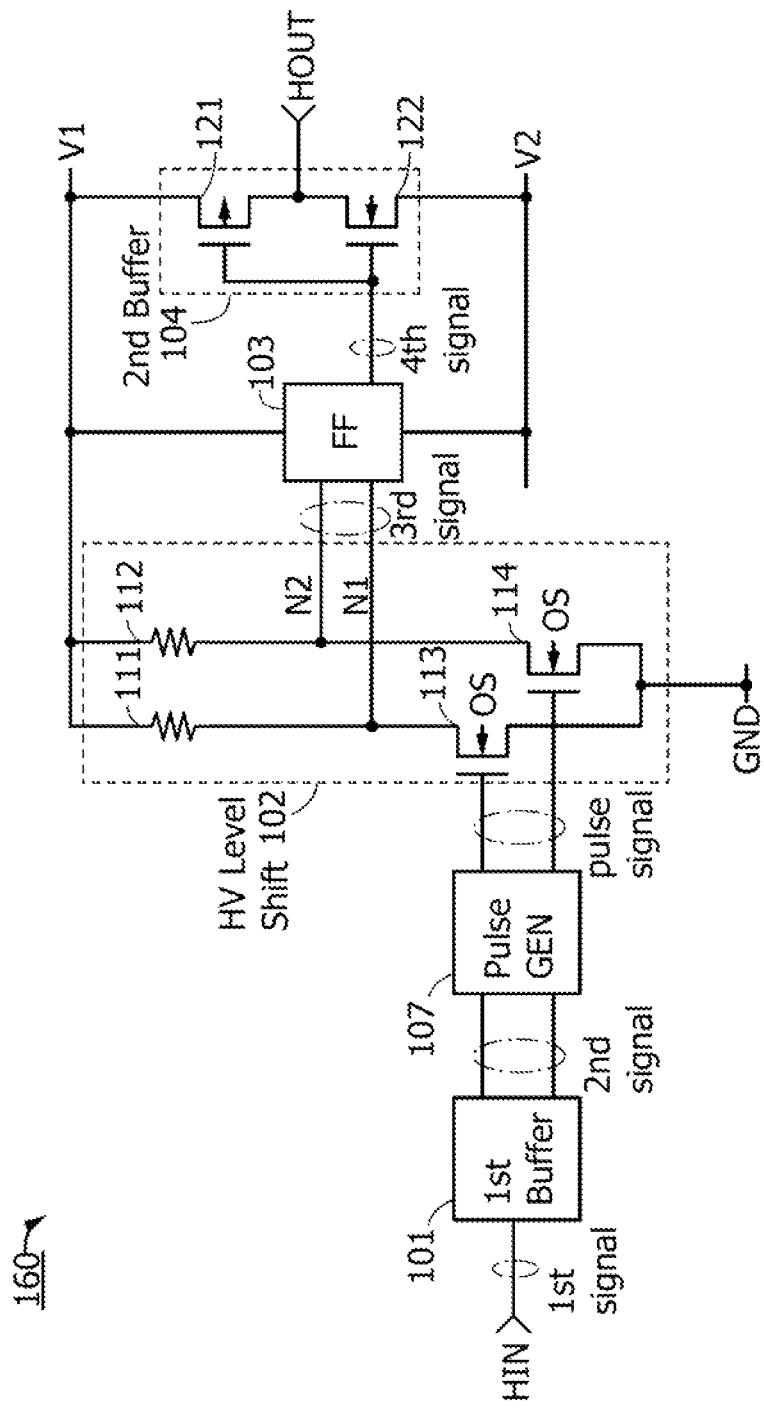
FIG. 12 shows a circuit diagram illustrating one embodiment of the present invention.

FIG. 12 illustrates another structure example of the semiconductor device of this embodiment. A semiconductor device 160 illustrated in FIG. 12, like the semiconductor device 100 illustrated in FIG. 1, is a circuit for controlling the drive of a higher potential power device. The semiconductor device 160 illustrated in FIG. 12 includes the buffer circuit 101 (denoted as 1st Buffer in FIG. 12) as a first circuit, a pulse generation circuit 107 (denoted as Pulse GEN in FIG. 12) as a second circuit, the level shift circuit 102 (denoted as HV Level Shift in FIG. 12) as a third circuit, the flip-flop circuit 103 (denoted as FF in FIG. 12) as a fourth circuit, and the buffer circuit 104 (denoted as 2nd Buffer in FIG. 12) as a fifth circuit.

The semiconductor device 160 illustrated in FIG. 12 has a structure in which the pulse generation circuit 107 is additionally provided between the buffer circuit 101 and the level shift circuit 102 in the structure of the semiconductor device 100 illustrated in FIG. 1. The buffer circuit 101, the level shift circuit 102, the flip-flop circuit 103, and the buffer circuit 104 included in the semiconductor device 160 can have structures similar to those described above; thus, detailed description thereof is omitted.

The pulse generation circuit 107 is a circuit for generating a pulse signal (denoted as pulse signal in FIG. 12), which serves as a trigger for turning on the transistor 113 or the transistor 114 included in the level shift circuit 102, on the basis of the second signal input from the buffer circuit 101. Specifically, the pulse generation circuit 107 generates a pulse signal that is synchronized with the fall of the first signal supplied to the terminal HIN from "H (high potential)" to "L (low potential)", and a pulse signal that is synchronized with the rise of the first signal from "L (low potential)" to "H (high potential)". The pulse signal that is synchronized with the fall of the first signal from "H (high potential)" to "L (low potential)" is output from one of the two output terminals of the pulse generation circuit 107 to the level shift circuit 102. Further, the pulse signal that is synchronized with the rise of the first signal from "L (low potential)" to "H (high potential)" is output from the other of the two output terminals of the pulse generation circuit 107 to the level shift circuit 102.

One of the two output terminals of the pulse generation circuit 107 is connected to the gate of the transistor 113 included in the level shift circuit 102, and the other is connected to the gate of the transistor 114 included in the level shift circuit 102. By providing the pulse generation circuit 107, the conductive state of the transistor 113 or the transistor 114 included in the level shift circuit 102 can be controlled intermittently. That case is preferable because the power consumption of the semiconductor device can be reduced as compared with the case in which the transistor 113 or the transistor 114 is continuously driven.

Figure 4:
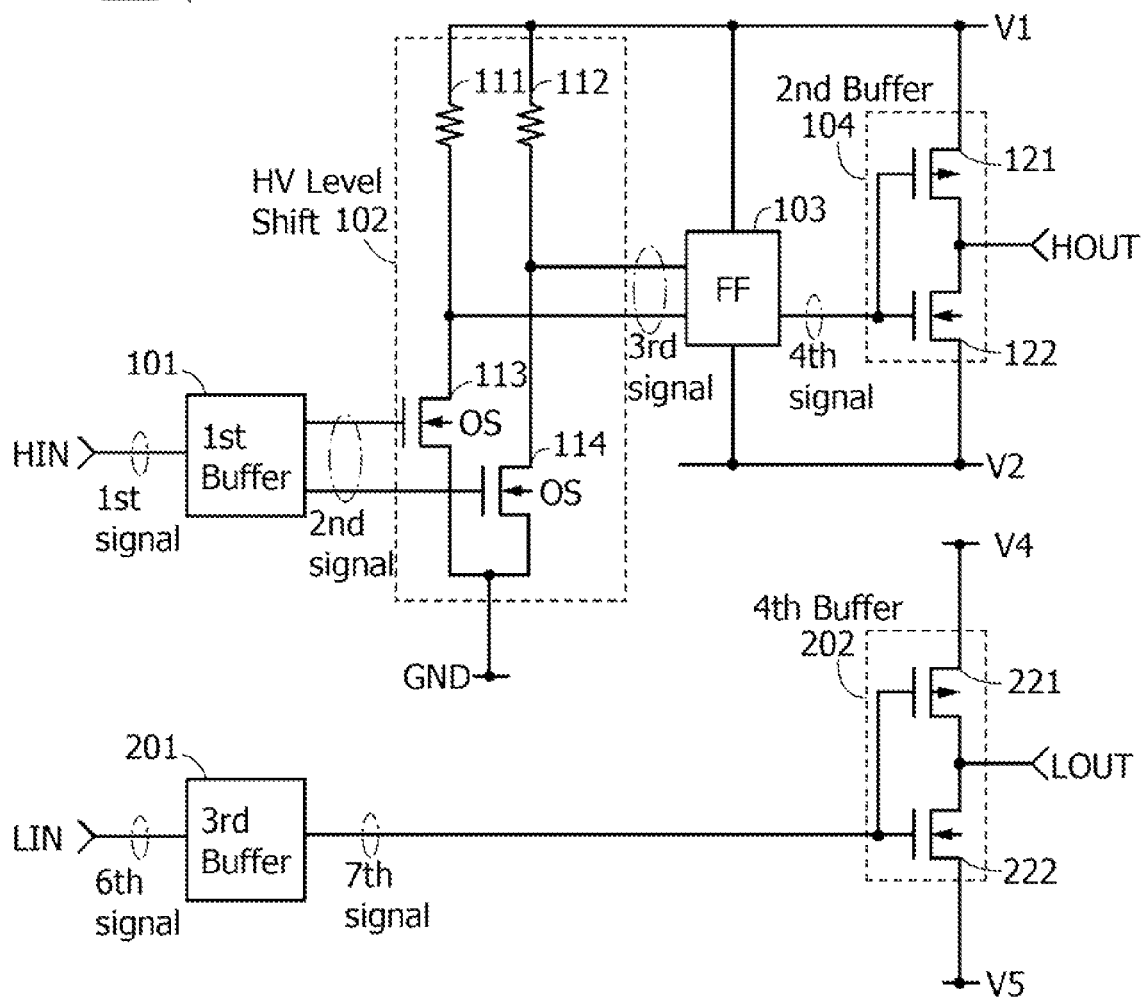
FIG. 4 shows a circuit diagram illustrating one embodiment of the present invention.

FIG. 4 illustrates another structure example of the semiconductor device of this embodiment. A semiconductor device 300 illustrated in FIG. 4 shows circuits for controlling the drive of a power device (not illustrated) connected to a high potential main power source and a power device (not illustrated) connected to a low potential main power source.

The semiconductor device 300 illustrated in FIG. 4 includes, as a circuit for controlling the drive of the higher potential power device, the buffer circuit 101 (denoted as 1st Buffer in FIG. 4), the level shift circuit 102 (denoted as HV Level Shift in FIG. 4), the flip-flop circuit 103 (denoted as FF in FIG. 4), and the buffer circuit 104 (denoted as 2nd Buffer in FIG. 4). In addition, the semiconductor device 300 includes, as a circuit for controlling the drive of the lower potential power device, a buffer circuit 201 (denoted as 3rd Buffer in FIG. 4) and a buffer circuit 202 (denoted as 4th Buffer in FIG. 4).

In the semiconductor device 300 illustrated in FIG. 4, the circuit for controlling the drive of the higher potential power device can have a structure similar to that of the semiconductor device 100 illustrated in FIG. 1. Alternatively, instead of the structure of the semiconductor device 100 illustrated in FIG. 1, the structure of the semiconductor device 150 illustrated in FIG. 3 may be applied to the circuit.

In the semiconductor device 300 illustrated in FIG. 4, the buffer circuit 201 is a circuit having a function of boosting a signal (sixth signal), which is input to a terminal LIN from a microcomputer or the like, to a signal capable of operating the buffer circuit 202 and/or converting the sixth signal into a signal (seventh signal) with increased electric charge supply capability, and outputting the seventh signal. The sixth signal is a signal for alternately turning on a transistor 221 and a transistor 222 included in the buffer circuit 202, and is input to the buffer circuit 202 after being boosted in the buffer circuit 201. In other words, the sixth signal is a signal for controlling the conduction or non-conduction of the lower potential power device electrically connected to an output terminal LOUT, and has an "H (high potential)" for turning on the power device and an "L (low potential)" for turning off the power device.

A specific structure of the buffer circuit 201 can be similar to, for example, that of the buffer circuit 101 illustrated in FIG. 2. Note that in the buffer circuit 201, the potential of the node N4 in FIG. 2 is output as the seventh signal.

The buffer circuit 202 is a circuit having a function of outputting a potential corresponding to the seventh signal output from the buffer circuit 201 to the lower potential power device (not illustrated) through the terminal LOUT. The buffer circuit 202 includes the transistor 221 and the transistor 222. An output terminal of the buffer circuit 201 is electrically connected to a gate of the transistor 221 and a gate of the transistor 222 included in the buffer circuit 202. Accordingly, the conduction or non-conduction of the transistor 221 and the transistor 222 is controlled by the output from the buffer circuit 201.

One of a source and a drain of the transistor 221 is electrically connected to the wiring supplied with the voltage V4 for driving the power device. A common power source can be used for the wiring supplied with the voltage V4 and a wiring supplied with the voltage V4 in the buffer circuit 101 and/or the buffer circuit 201. The other of the source and the drain of the transistor 221 is electrically connected to one of a source and a drain of the transistor 222. The other of the source and the drain of the transistor 222 is electrically connected to a wiring supplied with a voltage V5 for driving the power device.

The voltage V4 is a voltage for turning on the power device connected to the terminal LOUT. The voltage V5 is a voltage for turning off the power device connected to the terminal LOUT. A voltage output from the terminal LOUT to control switching of the power device connected to the terminal LOUT is switched between the voltage V4 and the voltage V5 by the buffer circuit 202 and is output. Note that the voltage V4 is higher than the voltage V5. The voltage V4 can be, for example, a low power source voltage Vcc. Further, the voltage V5 can be, for example, GND.

Note that as mentioned above, the seventh signal supplied to the gates of the transistor 221 and the transistor 222 is originally supplied to the terminal LIN. The seventh signal alternately turns on the transistor 221 and the transistor 222. Accordingly, the voltage V4 and the voltage V5 are alternately output from the terminal LOUT.

In addition, the signal input to the terminal HIN and the signal input to the terminal LIN are preferably inverted from each other. Hence, when the "H (high potential)" is output from the terminal HOUT and the higher potential power device connected to the terminal HOUT is turned on, the "L (low potential)" is preferably output from the terminal LOUT so that the lower potential power device connected to the terminal LOUT is turned off. Further, when the "L (low potential)" is output from the terminal HOUT and the higher potential power device connected to the terminal HOUT is turned off, the "H (high potential)" is preferably output from the terminal LOUT so that the lower potential power device connected to the terminal LOUT is turned on.

There is no particular limitation on the semiconductor material used for the transistor 221 and the transistor 222 included in the buffer circuit 202. Note that in order to increase the driving speed of the circuit, it is preferable to use a transistor with a high switching rate, for example, a transistor using single crystal silicon or the like. Alternatively, in the case of a buffer circuit including the n-type transistor 221, the n-type transistor 222, and the inverter circuit, an oxide semiconductor may be used for the transistor 221 and the transistor 222. In that case, the manufacturing process or costs of the semiconductor device can be reduced.

The semiconductor device described above in this embodiment includes, in a level shift circuit, a transistor including an oxide semiconductor that has a high withstand voltage. This enables the semiconductor device to operate stably and have high reliability while breakdown of the transistor is inhibited.

Moreover, in the semiconductor device shown in this embodiment, a transistor including silicon, which is capable of operating at higher speed than a transistor including an oxide semiconductor, is used as a transistor in a buffer circuit and/or a flip-flop circuit that require(s) lower withstand voltage than the level shift circuit. This allows providing a semiconductor device capable of operating at a high speed while dielectric breakdown in the circuit is inhibited. In addition, when the transistor including an oxide semiconductor is disposed over the transistor including silicon with an insulating film interposed therebetween, miniaturization of the semiconductor device is achieved.

Note that the structures and the like in the drawings referred to in this embodiment can each be combined as appropriate with any of the structures and the like in the other embodiments. In addition, the structures, methods, and the like in this embodiment can be combined with the structures, methods, and the like in the other embodiments.

Embodiment 2

Described in this embodiment are structure examples of a transistor including a channel formation region in an oxide semiconductor that can be used as the transistor 113 or the transistor 114 included in the level shift circuit 102 in the semiconductor device of Embodiment 1.

Figure 7A:
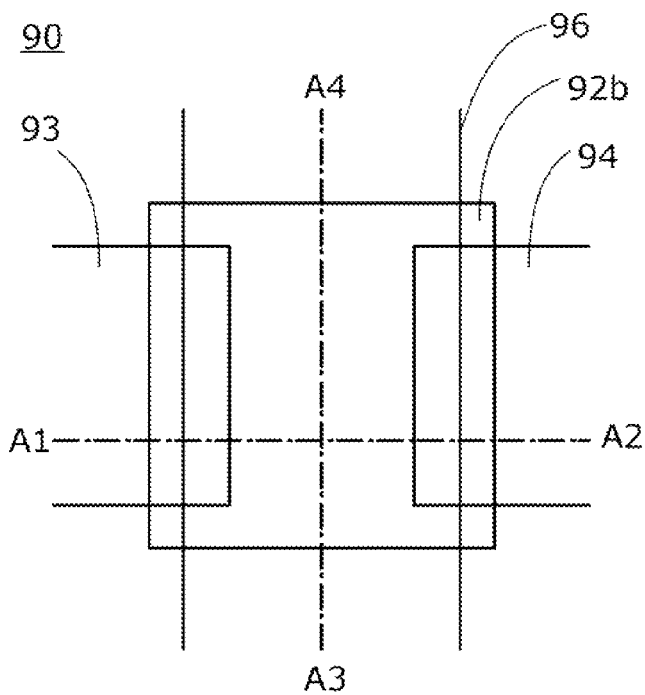
FIGS. 7A to 7C show diagrams illustrating a structure example of a transistor of one embodiment of the present invention.
Figure 7C:
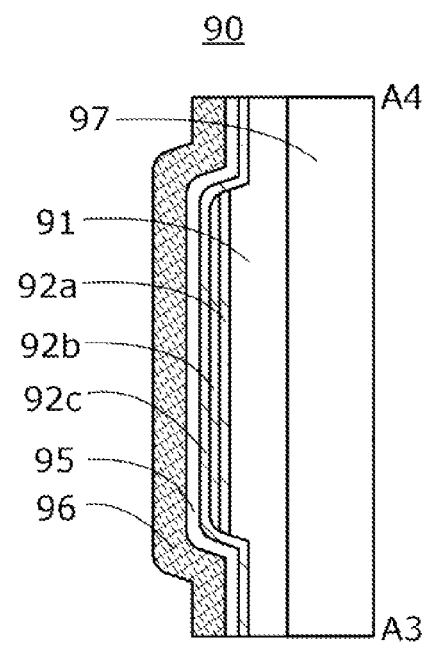
Figure 7B:
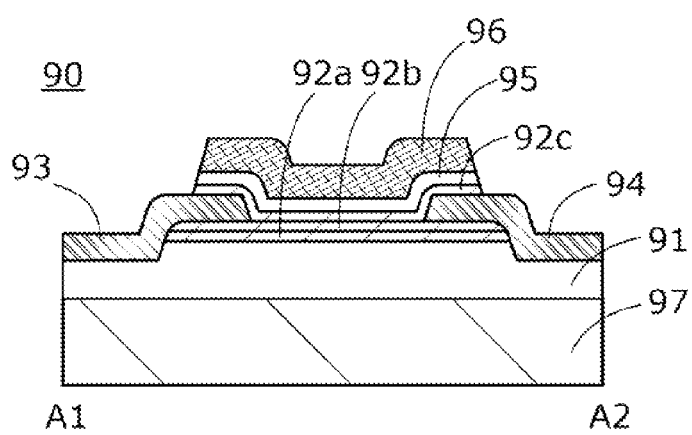

FIG. 7 illustrates a structure of a transistor 90 that includes a channel formation region in an oxide semiconductor as an example. FIG. 7(A) is a top view of the transistor 90. Note that insulating films are not illustrated in FIG. 7(A) to clarify the layout of the transistor 90. FIG. 7(B) is a cross-sectional view along dashed-dotted line A1-A2 in the top view in FIG. 7(A). FIG. 7(C) is a cross-sectional view along dashed-dotted line A3-A4 in the top view in FIG. 7(A).

As illustrated in FIG. 7, the transistor 90 includes an oxide semiconductor film 92a and an oxide semiconductor film 92b that are stacked in this order over an insulating film 91 formed over a substrate 97; a conductive film 93 and a conductive film 94 that are electrically connected to the oxide semiconductor film 92b and function as a source electrode or a drain electrode; an oxide semiconductor film 92c over the oxide semiconductor film 92b, the conductive film 93, and the conductive film 94; an insulating film 95 that functions as a gate insulating film and is located over the oxide semiconductor film 92c; and a conductive film 96 that functions as a gate electrode, lies over the insulating film 95, and overlaps with the oxide semiconductor film 92a to the oxide semiconductor film 92c. Note that the substrate 97 may be a glass substrate, a semiconductor substrate, or the like or may be an element substrate where semiconductor elements are formed over a glass substrate or on a semiconductor substrate.

FIG. 8 illustrates another specific example of the structure of the transistor 90. FIG. 8(A) is a top view of the transistor 90. Note that insulating films are not illustrated in FIG. 8(A) to clarify the layout of the transistor 90. FIG. 8(B) is a cross-sectional view along dashed-dotted line A1-A2 in the top view in FIG. 8(A). FIG. 8(C) is a cross-sectional view along dashed-dotted line A3-A4 in the top view in FIG. 8(A).

As illustrated in FIG. 8, the transistor 90 includes the oxide semiconductor film 92a to the oxide semiconductor film 92c that are stacked in this order over the insulating film 91; the conductive film 93 and the conductive film 94 that are electrically connected to the oxide semiconductor film 92c and function as a source electrode or a drain electrode; the insulating film 95 that functions as a gate insulating film and is located over the oxide semiconductor film 92c, the conductive film 93, and the conductive film 94; and the conductive film 96 that functions as a gate electrode, lies over the insulating film 95, and overlaps with the oxide semiconductor film 92a to the oxide semiconductor film 92c.

Note that FIG. 7 and FIG. 8 each illustrate the structure example of the transistor 90 in which the oxide semiconductor film 92a to the oxide semiconductor film 92c are stacked. The structure of the oxide semiconductor film included in the transistor 90 is not limited to a stacked-layer structure including a plurality of oxide semiconductor films and may be a single-layer structure.

In the case where the transistor 90 includes the semiconductor film in which the oxide semiconductor film 92a to the oxide semiconductor film 92c are stacked in this order, each of the oxide semiconductor film 92a and the oxide semiconductor film 92c is an oxide film that contains at least one of metal elements contained in the oxide semiconductor film 92b and in which energy at the conduction band minimum is closer to the vacuum level than that in the oxide semiconductor film 92b is by higher than or equal to 0.05 eV, 0.07 eV, 0.1 eV, or 0.15 eV and lower than or equal to 2 eV, 1 eV, 0.5 eV, or 0.4 eV. The oxide semiconductor film 92b preferably contains at least indium because carrier mobility is increased.

In the case where the transistor 90 includes the semiconductor films with the above structure, when an electric field is applied to the semiconductor films by applying voltage to the gate electrode, a channel region is formed in the oxide semiconductor film 92b, which has the lowest conduction band minimum among the semiconductor films. That is, since the oxide semiconductor film 92c is provided between the oxide semiconductor film 92b and the insulating film 95, a channel region can be formed in the oxide semiconductor film 92b, which is separated from the insulating film 95.

Since the oxide semiconductor film 92c contains at least one of metal elements contained in the oxide semiconductor film 92b, interface scattering is unlikely to occur at the interface between the oxide semiconductor film 92b and the oxide semiconductor film 92c. Thus, the movement of carriers is unlikely to be inhibited at the interface, which results in an increase in the field-effect mobility of the transistor 90.

When an interface state is formed at an interface between the oxide semiconductor film 92b and the oxide semiconductor film 92a, a channel region is also formed in a region close to the interface; thus, the threshold voltage of the transistor 90 varies. However, since the oxide semiconductor film 92a contains at least one of metal elements contained in the oxide semiconductor film 92b, an interface state is unlikely to be formed at the interface between the oxide semiconductor film 92b and the oxide semiconductor film 92a. Accordingly, the above structure can reduce variations in the electrical characteristics of the transistor 90, such as the threshold voltage.

Further, it is preferable that a plurality of oxide semiconductor films be stacked so that an interface state due to an impurity existing between the oxide semiconductor films, which inhibits carrier flow, is not formed at an interface between the oxide semiconductor films. This is because when an impurity exists between the stacked oxide semiconductor films, the energy continuity of the conduction band minimum between the oxide semiconductor films is lost, and carriers are trapped or disappear by recombination in the vicinity of the interface. By reducing an impurity existing between the films, a continuous junction (here, in particular, a well structure having a U shape in which the conduction band minimum is changed continuously between the films) is formed easily as compared with the case of merely stacking the plurality of oxide semiconductor films which contain at least one common metal as a main component.

In order to form such a continuous junction, it is necessary to form films continuously without being exposed to air, with use of a multi-chamber deposition apparatus (sputtering apparatus) including a load lock chamber. Each chamber in the sputtering apparatus is preferably subjected to high vacuum evacuation (to a vacuum of about $5 \times 10^{-7}$ Pa to $1 \times 10^{-4}$ Pa) with use of a suction vacuum evacuation pump such as a cryopump so that water or the like, which is an impurity for an oxide semiconductor, is removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of $-40°$ C. or lower, preferably $-80°$ C. or lower, further preferably $-100°$ C. or lower and is highly purified, moisture and the like can be prevented from entering the oxide semiconductor film as much as possible. Specifically, in the case where the oxide semiconductor film 92b is an In-M-Zn oxide film (M represents Ga, Y, Zr, La, Ce, or Nd) and a target having the atomic ratio of metal elements of In:M:Zn=$x_1$:$y_1$:$z_1$ is used for forming the oxide semiconductor film 92b, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film as the oxide semiconductor film 92b is easily formed. Typical examples of the atomic ratio of the metal elements of the target are In:M:Zn=1:1:1 and In:M:Zn=3:1:2.

Specifically, in the case where the oxide semiconductor film 92a and the oxide semiconductor film 92c are an In-M-Zn oxide film (M represents Ga, Y, Zr, La, Ce, or Nd) and a target having the atomic ratio of metal elements of In:M:Zn=$x_2$:$y_2$:$z_2$ is used for forming the oxide semiconductor film 92a and the oxide semiconductor film 92c, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, CAAC-OS films are easily formed as the oxide semiconductor film 92a and the oxide semiconductor film 92c. Typical examples of the atomic ratio of the metal elements of the target are In:M:Zn=1:3:2, In:M:Zn=1:3:4, In:M:Zn=1:3:6, and In:M:Zn=1:3:8.

Note that the oxide semiconductor film 92a and the oxide semiconductor film 92c each have a thickness of more than or equal to 3 nm and less than or equal to 100 nm, preferably more than or equal to 3 nm and less than or equal to 50 nm. The thickness of the oxide semiconductor film 92b is more than or equal to 3 nm and less than or equal to 200 nm, preferably more than or equal to 3 nm and less than or equal to 100 nm, further preferably more than or equal to 3 nm and less than or equal to 50 nm.

In the three-layer semiconductor film, the oxide semiconductor film 92a to the oxide semiconductor film 92c can be either amorphous or crystalline. Note that the oxide semiconductor film 92b in which a channel region is formed preferably has a crystalline structure, in which case the transistor 90 can have stable electrical characteristics.

Note that a channel formation region refers to a region of a semiconductor film of a transistor that overlaps with a gate electrode and is between a source electrode and a drain electrode. A channel region refers to a region through which current mainly flows in the channel formation region.

For example, when an In—Ga—Zn oxide film formed by a sputtering method is used as each of the oxide semiconductor film 92a and the oxide semiconductor film 92c, the oxide semiconductor film 92a and the oxide semiconductor film 92c can be formed with the use of an In—Ga—Zn oxide target (In:Ga:Zn=1:3:2 [atomic ratio]). The deposition conditions can be, for example, as follows: 30 sccm of argon gas and 15 sccm of oxygen gas are used as the deposition gas; the pressure is 0.4 Pa; the substrate temperature is 200° C.; and the DC power is 0.5 kW.

Although the oxide semiconductor films 92a to 92c can be formed by a sputtering method, they may be formed by another method, e.g., a thermal CVD method. A metal organic chemical vapor deposition (MOCVD) method or an atomic layer deposition (ALD) method may be employed as an example of a thermal CVD method.

Note that there are few carrier generation sources in a highly purified oxide semiconductor (purified oxide semiconductor) obtained by reduction of impurities such as moisture and hydrogen serving as electron donors (donors) and reduction of oxygen vacancies; therefore, the highly purified oxide semiconductor can be an intrinsic (i-type) semiconductor or a substantially i-type semiconductor. For this reason, a transistor having a channel formation region in a highly purified oxide semiconductor film has extremely low off-state current and high reliability. Further, a transistor in which a channel formation region is formed in the oxide semiconductor film easily has an electrical characteristic of a positive threshold voltage (also referred to as a normally-off characteristic).

Specifically, various experiments can prove a low off-state current of a transistor having a channel formation region in a highly purified oxide semiconductor film. For example, even when an element has a channel width of $1 \times 10^6$ µm and a channel length of 10 µm, off-state current can be less than or equal to the measurement limit of a semiconductor parameter analyzer, i.e., less than or equal to $1 \times 10^{-13}$ A, at a voltage (drain voltage) between the source electrode and the drain electrode of from 1 V to 10 V. In that case, it can be seen that the off-state current of the transistor normalized on the channel width is lower than or equal to 100 zA/µm. In addition, a capacitor and a transistor were connected to each other and off-state current was measured using a circuit in which charges flowing to or from the capacitor are controlled by the transistor. In the measurement, a highly purified oxide semiconductor film was used for a channel formation region of the transistor, and the off-state current of the transistor was measured from a change in the amount of charge of the capacitor per unit time. As a result, it was found that, in the case where the voltage between the source electrode and the drain electrode of the transistor was 3 V, a lower off-state current of several tens of yA/µm was obtained. Accordingly, the transistor including a channel formation region in the highly purified oxide semiconductor film has much lower off-state current than a crystalline silicon transistor.

Furthermore, because an oxide semiconductor has an energy gap as wide as about 3.0 eV to 3.5 eV and includes extremely few thermally excited carriers, the characteristics of the transistor including an oxide semiconductor do not deteriorate even in a high temperature environment and high withstand voltage can be obtained.

In the case where an oxide semiconductor film is used as the semiconductor film, at least indium (In) or zinc (Zn) is preferably included as an oxide semiconductor. In addition, as a stabilizer for reducing variations in electrical characteristics among transistors formed using such an oxide semiconductor, gallium (Ga) is preferably contained in addition to In and Zn. Further, tin (Sn) is preferably contained as a stabilizer. Further, hafnium (Hf) is preferably contained as a stabilizer. Further, aluminum (Al) is preferably contained as a stabilizer. Further, zirconium (Zr) is preferably contained as a stabilizer.

Among oxide semiconductors, unlike silicon carbide, gallium nitride, or gallium oxide, an In—Ga—Zn oxide, an In—Sn—Zn oxide, or the like has an advantage of high mass productivity because a transistor with favorable electrical characteristics can be formed by a sputtering method or a wet process. In addition, unlike silicon carbide, gallium nitride, or gallium oxide, with the use of the In—Ga—Zn oxide, a transistor with favorable electrical characteristics can be formed over a glass substrate. Moreover, a larger substrate can be used.

Further, as another stabilizer, one or more lanthanoids selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, any of the following oxides can be used, for example: indium oxide, gallium oxide, tin oxide, zinc oxide, an In—Zn oxide, an Sn—Zn oxide, an Al—Zn oxide, a Zn—Mg oxide, an Sn—Mg oxide, an In—Mg oxide, an In—Ga oxide, an In—Ga—Zn oxide (also referred to as IGZO), an In—Al—Zn oxide, an In—Sn—Zn oxide, an Sn—Ga—Zn oxide, an Al—Ga—Zn oxide, an Sn—Al—Zn oxide, an In—Hf—Zn oxide, an In—La—Zn oxide, an In—Pr—Zn oxide, an In—Nd—Zn oxide, an In—Ce—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—

Hf—Ga—Zn oxide, an In—Al—Ga—Zn oxide, an In—Sn—Al—Zn oxide, an In—Sn—Hf—Zn oxide, and an In—Hf—Al—Zn oxide.

Note that, for example, an In—Ga—Zn oxide refers to an oxide containing In, Ga, and Zn, and there is no limitation on the ratio of In to Ga and Zn. Furthermore, the In—Ga—Zn oxide may contain a metal element other than In, Ga, and Zn. The In—Ga—Zn oxide has sufficiently high resistance when no electric field is applied thereto, so that off-state current can be sufficiently reduced. Moreover, the In—Ga—Zn oxide has high mobility.

For example, high mobility can be obtained relatively easily in the case of using an In—Sn—Zn oxide. Meanwhile, when an In—Ga—Zn oxide is used, the mobility can be increased by reducing the defect density in a bulk.

In the transistor 90, a metal in the source electrode and the drain electrode might extract oxygen from the oxide semiconductor film depending on a conductive material used for the source electrode and the drain electrode. In such a case, regions of the oxide semiconductor film that are in contact with the source electrode and the drain electrode are changed to n-type regions due to the formation of oxygen vacancies. The n-type region serves as a source region or a drain region, resulting in a decrease in the contact resistance between the oxide semiconductor film and the source electrode or the drain electrode. Accordingly, the formation of the n-type region increases the mobility and on-state current of the transistor 90, achieving the high-speed operation of a semiconductor device using the transistor 90.

Note that the extraction of oxygen by a metal in the source electrode and the drain electrode is probably caused when the source electrode and the drain electrode are formed by a sputtering method or the like or when heat treatment is performed after the formation of the source electrode and the drain electrode. The n-type region is more likely to be formed by farming the source electrode and the drain electrode with use of a conductive material that is easily bonded to oxygen. Examples of such a conductive material include Al, Cr, Cu, Ta, Ti, Mo, and W.

In the case where the semiconductor film including the stacked oxide semiconductor films is used in the transistor 90, the n-type region preferably extends to the oxide semiconductor film 92b serving as a channel region in order that the mobility and on-state current of the transistor 90 can be further increased and the semiconductor device can operate at higher speed.

The insulating film 91 is preferably an insulating film having a function of supplying oxygen to the oxide semiconductor film 92a to the oxide semiconductor film 92c by heating. It is preferable that the number of defects in the insulating film 91 be small, and typical spin density at g=2.001 due to a dangling bond of silicon be lower than or equal to $1 \times 10^{18}$ spins/cm$^3$. The spin density is measured by ESR spectroscopy.

The insulating film 91, which has a function of supplying oxygen to the oxide semiconductor film 92a to the oxide semiconductor film 92c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 91 can be formed by a plasma chemical vapor deposition (CVD) method, a sputtering method, or the like.

Note that in this specification, oxynitride refers to a material containing more oxygen than nitrogen, and nitride oxide refers to a material containing more nitrogen than oxygen.

Note that in the transistor 90 illustrated in FIG. 7 and FIG. 8, the conductive film 96 overlaps with end portions of the oxide semiconductor film 92b including a channel region that do not overlap with the conductive film 93 and the conductive film 94, i.e., end portions of the oxide semiconductor film 92b that are in a region different from a region where the conductive film 93 and the conductive film 94 are located. When the end portions of the oxide semiconductor film 92b are exposed to plasma by etching for forming the end portions, a chlorine radical, a fluorine radical, or other radicals generated from an etching gas are easily bonded to a metal element contained in an oxide semiconductor. For this reason, in the end portions of the oxide semiconductor film, oxygen bonded to the metal element is easily released, so that an oxygen vacancy is easily formed; thus, the end portions of the oxide semiconductor film easily have n-type conductivity. However, an electric field applied to the end portions can be controlled by controlling the potential of the conductive film 96 because the end portions of the oxide semiconductor film 92b that do not overlap with the conductive film 93 and the conductive film 94 overlap with the conductive film 96 in the transistor 90 illustrated in FIG. 7 and FIG. 8. Consequently, current that flows between the conductive film 93 and the conductive 94 through the end portions of the oxide semiconductor film 92b can be controlled by the potential applied to the conductive film 96. Such a structure of the transistor 90 is referred to as a surrounded channel (s-channel) structure.

With the s-channel structure, specifically, when a potential at which the transistor 90 is turned off is supplied to the conductive film 96, the amount of off-state current that flows between the conductive film 93 and the conductive film 94 through the end portions can be reduced. For this reason, in the transistor 90, even when the distance between the conductive film 93 and the conductive film 94 at the end portions of the oxide semiconductor film 92b is reduced as a result of reducing the channel length to obtain high on-state current, the transistor 90 can have a low off-state current. Consequently, with the short channel length, the transistor 90 can have a high on-state current when in an on state and a low off-state current when in an off state.

Also with the s-channel structure, specifically, when a potential at which the transistor 90 is turned on is supplied to the conductive film 96, the amount of current that flows between the conductive film 93 and the conductive film 94 through the end portions can be increased. The current contributes to an increase in the field-effect mobility and an increase in the on-state current of the transistor 90. When the end portions of the oxide semiconductor film 92b overlap with the conductive film 96, carriers flow in a wide region of the oxide semiconductor film 92b without being limited to a region in the vicinity of the interface between the oxide semiconductor film 92b and the insulating film 95, which results in an increase in the amount of carrier movement in the transistor 90. As a result, the on-state current of the transistor 90 is increased, and the field-effect mobility is increased to, typically, greater than or equal to 10 cm$^2$/V·s or to greater than or equal to 20 cm$^2$/V·s. Note that here, the field-effect mobility is not an approximate value of the mobility as the physical property of the oxide semiconductor film but is the apparent field-effect mobility in a saturation region of the transistor, which is an index of current drive capability.

FIG. 9 illustrates a modification example of the transistor 90 in FIG. 7 and FIG. 8. FIG. 9(A) is a top view of a transistor 90B. Note that insulating films are not illustrated in FIG. 9(A) to clarify the layout of the transistor 90B. FIG. 9(B) is a cross-sectional view along dashed-dotted line A1-A2 in the top view in FIG. 9(A). FIG. 9(C) is a cross-sectional view along dashed-dotted line A3-A4 in the top view in FIG. 9(A).

The transistor 90B illustrated in FIG. 9 is different from the transistor 90 only in the shape of the conductive film 96b that has a region functioning as a gate electrode. Note that the other structures of the transistor 90B are similar to those of the transistor 90 described above; thus, detailed description thereof is omitted.

In the transistor 90B, the conductive film 96b is provided so as to overlap with the conductive film 93 and not to overlap with the conductive film 94. In the transistor 90B, the conductive film 96b includes a region functioning as a gate electrode, the conductive film 93 includes a region functioning as a source electrode, and the conductive film 94 includes a region functioning as a drain electrode. The transistor 90B has further improved gate-drain withstand voltage because the drain electrode and the gate electrode are located apart from each other so as not to overlap with each other. Accordingly, the transistor 90B can have high reliability even when is driven at an extremely high voltage.

The structure of an oxide semiconductor film capable of being used for a transistor will be described below.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS film will be described.

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting unevenness of a surface where the CAAC-OS film is formed (hereinafter, a surface where the CAAC-OS film is formed is also referred to as a formation surface) or a top surface of the CAAC-OS film, and is arranged parallel to the formation surface or the top surface of the CAAC-OS film.

On the other hand, according to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears in some cases when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak may also be observed when 2θ is around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear when 2θ is around 31° and that a peak not appear when 2θ is around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, or carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has small changes in electrical characteristics and high reliability. Electric charge captured by the carrier traps in the oxide semiconductor film takes a long time to be released, and might behave like fixed electric charge. Thus, the transistor that includes the oxide semiconductor film having high impurity concentration and a high density of defect states has unstable electrical characteristics in some cases.

In a transistor using the CAAC-OS film, changes in electrical characteristics due to irradiation with visible light or ultraviolet light are small.

Next, a microcrystalline oxide semiconductor film will be described.

The microcrystalline oxide semiconductor film has a region in which a crystal part is observed and a region in which a crystal part is not observed clearly in a high-resolution TEM image. In most cases, the size of a crystal part included in the microcrystalline oxide semiconductor film is greater than or equal to 1 nm and less than or equal to 100 nm, or greater than or equal to 1 min and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high-resolution TEM image of the nc-OS film, for example, a crystal grain boundary cannot be found clearly in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. The nc-OS film does not have regularity of crystal orientation between different crystal parts. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the diameter of a crystal part, a peak that shows a crystal plane does not appear. Furthermore, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film will be described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and a halo pattern appears when the amorphous oxide semiconductor film is subjected to nanobeam electron diffraction.

Note that an oxide semiconductor film sometimes has a structure having physical properties intermediate between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void is observed in some cases. Furthermore, in the high-resolution TEM image, there are a region where a crystal part is clearly observed and a region where a crystal part is not observed. In some cases, growth of the crystal part occurs due to the crystallization of the a-like OS film, which is induced by a slight amount of electron beam employed in the TEM observation. In contrast, in the nc-OS film that has good quality, crystallization hardly occurs by a slight amount of electron beam used for TEM observation.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

Furthermore, the density of an oxide semiconductor film varies depending on the structure in some cases. For example, when the composition of an oxide semiconductor film is determined, the structure of the oxide semiconductor film can be expected by comparing the density of the oxide semiconductor film with the density of a single crystal oxide semiconductor having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film having a density of lower than 78% of the density of the single crystal oxide semiconductor.

Specific examples of the above description are given. For example, in the case of an oxide semiconductor film having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor film having an atomic ratio of In:Ga:Zn=1:1:1, the density of the a-like OS film is higher than or equal to 5.0 $g/cm^3$ and lower than 5.9 $g/cm^3$. For example, in the case of the oxide semiconductor film having an atomic ratio of In:Ga:Zn=1:1:1, the density of each of the nc-OS film and the CAAC-OS film is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate the density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

Note that an oxide semiconductor film may be a stacked film including two or more films of an amorphous oxide semiconductor film, an a-like OS film, a microcrystalline oxide semiconductor film, and a CAAC-OS film, for example.

For the deposition of the CAAC-OS film, the following conditions are preferably used.

By reducing the amount of impurities entering during the deposition, the crystal state can be prevented from being broken by the impurities. For example, the concentration of impurities (hydrogen, water, carbon dioxide, nitrogen, or the like) which exist in a treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle occurs after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like or pellet-like sputtered particle reaches the substrate, migration occurs on the substrate, so that a flat plane of the sputtered particle is attached to the substrate.

Furthermore, preferably, the proportion of oxygen in the deposition gas is increased and the power is optimized in order to reduce plasma damage at the deposition. The proportion of oxygen in the deposition gas is 30 vol % or higher, preferably 100 vol %.

As an example of the target, an In—Ga—Zn oxide target is described below.

The In—Ga—Zn oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are given positive numbers. Here, the predetermined molar ratio of $InO_X$ powder to $GaO_Y$ powder and $ZnO_Z$ powder is, for example, 2:2:1, 8:4:3, 3:1:1, 1:1:1, 4:2:3, 2:1:3, or 3:1:2. The kinds of powders and the molar ratio for mixing powders may be determined as appropriate depending on the desired target. A CAAC-OS film formed using a target with a molar ratio of In:Ga:Zn=2:1:3 can have a particularly high proportion of regions where a diffraction pattern of CAAC-OS is observed in a predetermined area (also referred to as proportion of CAAC); thus, a transistor having a channel formation region in this CAAC-OS film can have excellent frequency characteristics (f characteristics).

An alkali metal is not an element included in an oxide semiconductor and thus is an impurity. Likewise, an alkaline earth metal is an impurity when the alkaline earth metal is not a component of the oxide semiconductor. When an insulating film in contact with an oxide semiconductor film is an oxide, Na, among the alkali metals, diffuses into the insulating film and becomes $Na^+$. Further, in the oxide semiconductor film, Na cuts or enters a bond between metal and oxygen which are components of the oxide semiconductor. As a result, the electrical characteristics of the transistor deteriorate; for example, the transistor is placed in a normally-on state due to a negative shift of the threshold voltage or the mobility is decreased. In addition, the characteristics of transistors vary. Specifically, the measurement value of a Na concentration by secondary ion mass spectrometry is less than or equal to $5\times10^{16}/cm^3$, preferably less than or equal to $1\times10^{16}/cm^3$, and further preferably less than or equal to $1\times10^{15}/cm^3$. Similarly, the measurement value of a Li concentration is preferably less than or equal to $5\times10^{15}/cm^3$, further preferably less than or equal to $1\times10^{15}/cm^3$. Similarly, the measurement value of a K concentration is preferably less than or equal to $5\times10^{15}/cm^3$, further preferably less than or equal to $1\times10^{15}/cm^3$.

When metal oxide containing indium is used, silicon or carbon having higher bond energy with oxygen than indium might cut the bond between indium and oxygen, so that an oxygen vacancy may be formed. Accordingly, when silicon or carbon is contained in the oxide semiconductor film, the electrical characteristics of the transistor are likely to deteriorate as in the case of using an alkali metal or an alkaline earth metal. Thus, the concentrations of silicon and carbon in the oxide semiconductor film are preferably low. Specifically, the C concentration or the Si concentration measured by secondary ion mass spectrometry is less than or equal to $1\times10^{18}/cm^3$. In this case, the deterioration of the electrical characteristics of the transistor can be prevented, so that the reliability of a semiconductor device can be improved.

The structures, methods, and the like in this embodiment can be combined as appropriate with any of the structures, methods, and the like in the other embodiments.

Embodiment 3

This embodiment shows an example of a cross-sectional structure of a semiconductor device of one embodiment of the present invention.

<Example of Cross-Sectional Structure of Semiconductor Device: 1>

Figure 5:
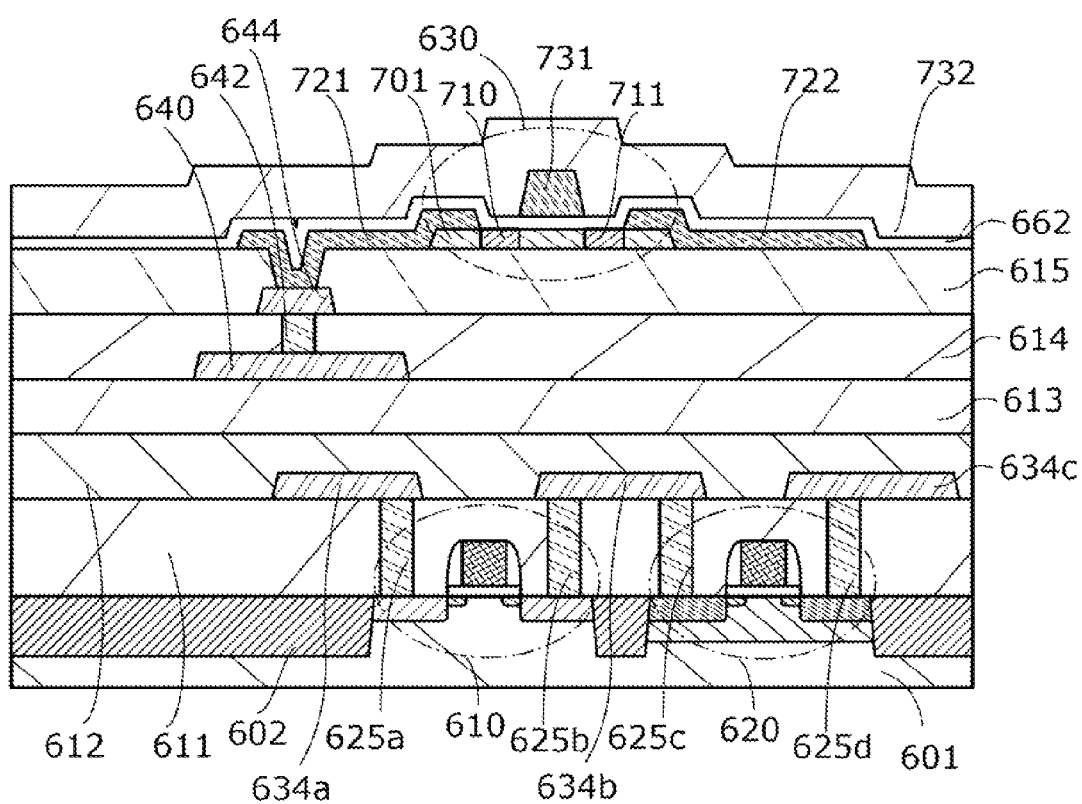
FIG. 5 shows a diagram illustrating a cross-sectional structure of a semiconductor device of one embodiment of the present invention.

FIG. 5 illustrates an example of a cross-sectional structure of a semiconductor device of one embodiment of the present invention. FIG. 5 illustrates a structure example of a semiconductor device in which a transistor 630 corresponding to the transistor 113 or the transistor 114 in the level shift circuit 102 is formed over a transistor 610 and a transistor 620 corresponding to the transistors included in the buffer circuit 101, the flip-flop circuit 103, or the buffer circuit 104 in the semiconductor device 100 illustrated in FIG. 1. The transistor 630 is a transistor in which a channel is formed in an oxide semiconductor.

The transistor 610 and the transistor 620 each have a channel formation region in a semiconductor film or a semiconductor substrate of silicon, germanium, or the like in an amorphous, microcrystalline, polycrystalline, or single crystal state. Alternatively, the transistor 610 and the transistor 620 may each have the channel formation region in an oxide semiconductor film or an oxide semiconductor substrate. The transistor 630 is disposed so as to have a region overlapping with the transistor 610 and the transistor 620, allowing miniaturization of the semiconductor device. In the case where channel formation regions of all the transistors are included in an oxide semiconductor film or an oxide semiconductor substrate, the transistor 630 is not necessarily stacked over the transistor 610 and the transistor 620, and the transistor 610, the transistor 620, and the transistor 630 may be formed in the same layer. In that case, the semiconductor device can be manufactured in a simplified process Note that FIG. 5 shows the case where one of the transistor 610 and the transistor 620 is an n-type transistor and the other is a p-type transistor. However, one embodiment of the present invention is not limited thereto, and transistors with the same conductivity type may be used for the buffer circuit 101, the flip-flop circuit 103, and the buffer circuit 104. When these circuits are formed using transistors with the same conductivity type, the number of photomasks for separately forming n-type and p-type transistors can be reduced, resulting in a reduction in the production costs of the semiconductor device.

In the case where the transistor 610 and the transistor 620 are formed using a thin silicon film, any of the following can be used for the thin film: amorphous silicon formed by a sputtering method or a vapor phase growth method such as a plasma CVD method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A semiconductor substrate 601 where the transistor 610 and the transistor 620 are formed can be, for example, a silicon substrate, a germanium substrate, a silicon germanium substrate, or the like. FIG. 5 shows an example in which a single crystal silicon substrate is used as the semiconductor substrate 601.

The transistor 610 and the transistor 620 are electrically isolated from each other by an element isolation method. As the element isolation method, a local oxidation of silicon (LOCOS) method, a shallow trench isolation (STI) method, or the like can be employed. FIG. 5 shows an example in which the trench isolation method is used to electrically isolate the transistor 610 and the transistor 620. Specifically, FIG. 5 shows an example in which trenches are formed in the semiconductor substrate 601 by etching or the like, and then element separation regions 602 are formed by embedding an insulator including silicon oxide or the like in the trenches, whereby the transistor 610 and the transistor 620 are electrically isolated from each other.

An insulating film 611 is formed over the transistor 610 and the transistor 620. Openings are formed in the insulating film 611. In the openings, a conductive film 625*a* and a conductive film 625*b* that are electrically connected to a source or a drain of the transistor 610 and a conductive film 625*c* and a conductive film 625*d* that are electrically connected to a source or a drain of the transistor 620 are formed.

Then, the conductive film 625*a* is electrically connected to a conductive film 634*a* formed over the insulating film 611, the conductive film 625*b* and the conductive film 625*c* are electrically connected to a conductive film 634*b* formed over the insulating film 611, and the conductive film 625*d* is electrically connected to a conductive film 634*c* formed over the insulating film 611.

An insulating film 612 and an insulating film 613 are formed over the conductive film 634*a* to the conductive film 634*c*. Although not clearly illustrated in FIG. 5, conductive films electrically connected to the transistor 610, the transistor 620, or the transistor 630 are formed over the insulating film 612 or in openings provided in the insulating film 612 and/or the insulating film 613.

A conductive film 640 is formed over the insulating film 613, and an insulating film 614 is formed over the conductive film 640. The insulating film 614 includes an opening, and a conductive film 642 electrically connected to the conductive film 640 is formed in the opening.

A conductive film 644 is formed over the insulating film 614. The conductive film 644 is electrically connected to the conductive film 642. An insulating film 615 is formed over the conductive film 644. In FIG. 5, the transistor 630 is formed over the insulating film 615.

Note that the electrical connection of the conductive films provided between the transistor 610 and the transistor 620, and the transistor 630 is not limited to the structure illustrated in FIG. 5, and the structures of the conductive films and the insulating layers provided therebetween can be determined as appropriate.

The transistor 630 includes, over the insulating film 615, a semiconductor film 701 including an oxide semiconductor, a conductive film 721 and a conductive film 722 functioning as a source or a drain over the semiconductor film 701, a gate insulating film 662 over the semiconductor film 701, the conductive film 721, and the conductive film 722, and a gate electrode 731 which lies over the gate insulating film 662 and overlaps with the semiconductor film 701 between the conductive film 721 and the conductive film 722.

In the semiconductor film 701 of the transistor 630, there is a region 710 between a region overlapping with the conductive film 721 and a region overlapping with the gate electrode 731. In addition, in the semiconductor film 701 of the transistor 630, there is a region 711 between a region overlapping with the conductive film 722 and the region overlapping with the gate electrode 731. When argon, an impurity that imparts p-type conductivity to the semiconductor film 701, or an impurity that imparts n-type conductivity to the semiconductor film 701 is added to the region 710 and the region 711 using the conductive film 721, the conductive film 722, and the gate electrode 731 as a mask, the resistivity of the region 710 and the region 711 can be made lower than that of the region overlapping with the gate electrode 731 in the semiconductor film 701.

Note that in FIG. 5, the transistor 630 only needs to have the gate electrode 731 on at least one side of the semiconductor film 701; alternatively, the transistor 630 may have a pair of gate electrodes with the semiconductor film 701 positioned therebetween. In the case where the transistor 630 has a pair of gate electrodes with the semiconductor film 701 positioned therebetween, one of the gate electrodes may be supplied with a signal for controlling the on/off state, and the other of the gate electrodes may be supplied with a potential from another wiring. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In addition, FIG. 5 shows an example in which the transistor 630 has a single-gate structure where one channel formation region corresponding to one gate electrode 731 is provided. However, the transistor 630 may have a multi-gate structure where a plurality of electrically connected gate electrodes are provided so that a plurality of channel formation regions are included in one active layer.

In the semiconductor device illustrated in FIG. 5, the transistor 630 is provided over the transistor 610 and the transistor 620 with the insulating films provided therebetween. Between the transistor 610 and the transistor 620, and the transistor 630, the plurality of conductive films serving as wirings are provided. Wirings and electrodes provided in an upper layer and a lower layer are electrically connected to each other by the plurality of conductive films embedded in the insulating films.

Such a structure including stacked transistors can increase the degree of integration of a semiconductor device.

Note that in the case where single crystal silicon is used for the semiconductor substrate 601, the concentration of hydrogen in the insulating film in the vicinity of the semiconductor substrate 601 is preferably high. The hydrogen terminates dangling bonds of silicon, so that the reliability of the transistor 610 and the transistor 620 can be increased. In contrast, the concentration of hydrogen in the insulating film in the vicinity of the oxide semiconductor film of the transistor 630 is preferably low. The hydrogen causes generation of carriers in an oxide semiconductor, which might lead to a decrease in the reliability of the transistor 630 when the hydrogen concentration in the insulating film in the vicinity of the oxide semiconductor film is high. Therefore, in the case where the transistor 610 and the transistor 620 each including single crystal silicon and the transistor 630 including an oxide semiconductor are stacked, providing an insulating film having a function of blocking hydrogen between the transistors is effective to increase the reliability of the transistors.

Such an insulating film may be, for example, formed to have a single-layer structure or a stacked-layer structure using an insulating film containing aluminum oxide, aluminum oxynitride, gallium oxide, gallium oxynitride, yttrium oxide, yttrium oxynitride, hafnium oxide, hafnium oxynitride, yttria-stabilized zirconia (YSZ), silicon nitride, or the like.

As an insulating film 732 that covers the transistor 630 using an oxide semiconductor, an insulating film having a function of blocking hydrogen is preferably formed. Note that an aluminum oxide film is preferably provided as the insulating film 732. The aluminum oxide film has a high effect of blocking both oxygen and impurities such as hydrogen and moisture. Therefore, the use of the aluminum oxide film as the insulating film 732 covering the transistor 630 makes it possible to prevent release of oxygen from the oxide semiconductor included in the transistor 630 and entry of water and hydrogen into the oxide semiconductor film.

<Example of Cross-Sectional Structure of Semiconductor Device: 2>

Figure 6:
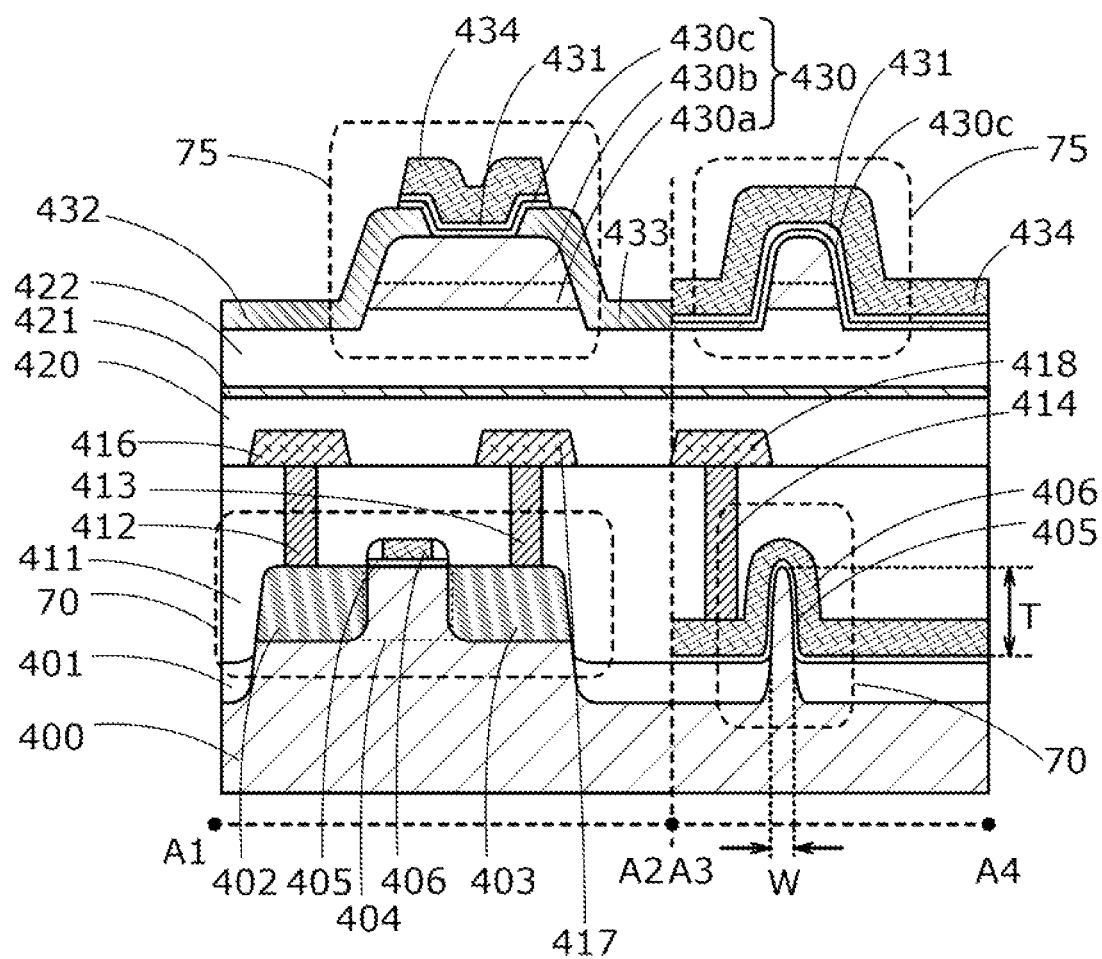
FIG. 6 shows a diagram illustrating a cross-sectional structure of a semiconductor device of one embodiment of the present invention.

FIG. 6 illustrates another example of a cross-sectional structure of the semiconductor device 100 illustrated in FIG. 1. Note that FIG. 6 illustrates a cross-sectional view of a transistor 70 included in the buffer circuit 101, the flip-flop circuit 103, or the buffer circuit 104, and a transistor 75 included in the level shift circuit 102. Specifically, a region along dashed line A1-A2 shows a cross-sectional structure of the transistor 75 and the transistor 70 in the channel length direction. A region along dashed line A3-A4 shows a structure of the transistor 75 and the transistor 70 in the channel width direction. Note that in one embodiment of the present invention, the channel length direction of one transistor is not necessarily the same as the channel length direction of another transistor.

Note that the channel length direction of a transistor refers to a direction in which a carrier moves between a source (a source region or a source electrode) and a drain (a drain region or a drain electrode), and the channel width direction refers to a direction perpendicular to the channel length direction in a plane parallel to a substrate.

Further, FIG. 6 shows an example in which the transistor 75 including a channel formation region in an oxide semiconductor film is formed over the transistor 70 including a channel formation region in a single crystal silicon substrate.

A substrate 400 where the transistor 70 is formed can be, for example, a silicon substrate, a germanium substrate, a silicon germanium substrate, or the like. FIG. 6 shows an example in which a single crystal silicon substrate is used as the substrate 400.

In addition, the transistor 70 is electrically isolated by an element isolation method. As the element isolation method, a shallow trench isolation (STI) method, or the like can be employed. FIG. 6 shows an example in which the trench isolation method is used to electrically isolate the transistor 70. Specifically, FIG. 6 shows an example in which trenches are formed in the substrate 400 by etching or the like, and then element separation regions 401 are formed by embedding an insulator including silicon oxide or the like in the trenches and then removing part of the insulator by etching or the like, whereby the transistor 70 is electrically isolated.

Note that in the case where the transistor 70 has the same conductivity type as an adjacent transistor, element isolation from the adjacent transistor is not necessarily performed. In that case, the layout area can be reduced.

On a projection of the substrate 400 in a region other than the trench, an impurity region 402 and an impurity region 403 of the transistor 70 and a channel formation region 404 positioned between the impurity region 402 and the impurity region 403 are provided. The transistor 70 includes an insulating film 405 covering the channel formation region 404 and a gate electrode 406 overlapping with the channel formation region 404 with the insulating film 405 positioned therebetween.

In the transistor 70, a side portion and an upper portion of the projection in the channel formation region 404 overlap with the gate electrode 406 with the insulating film 405 positioned therebetween, so that carriers flow in a wide area including the side portion and the upper portion of the channel formation region 404. Thus, the area of the transistor 70 on the substrate can be small, and the amount of transfer of carriers in the transistor 70 can be increased. As a result, the on-state current and field-effect mobility of the transistor 70 are increased. In particular, if the length in the channel width direction (channel width) of the projection in the channel formation region 404 is denoted by W and the film thickness of the projection in the channel formation region 404 is denoted by T, carriers flow in a wider area when the aspect ratio that corresponds to the ratio of the film thickness T to the channel width W is high. Consequently, the on-state current and field-effect mobility of the transistor 70 can be further increased.

Note that in the case of the transistor 70 formed using a bulk semiconductor substrate, the aspect ratio is preferably higher than or equal to 0.5, more preferably higher than or equal to 1.

An insulating film 411 is provided over the transistor 70. Openings are formed in the insulating film 411. In the openings, a conductive film 412 and a conductive film 413 electrically connected to the impurity region 402 and the impurity region 403, respectively, and a conductive film 414 electrically connected to the gate electrode 406 are formed.

Then, the conductive film 412 is electrically connected to a conductive film 416 formed over the insulating film 411, the conductive film 413 is electrically connected to a conductive film 417 formed over the insulating film 411, and the conductive film 414 is electrically connected to a conductive film 418 formed over the insulating film 411.

An insulating film 420 is provided over the conductive film 416 to the conductive film 418. An insulating film 421 having an effect of blocking diffusion of oxygen, hydrogen, or water is provided over the insulating film 420. As the insulating film 421 has higher density and becomes denser or has fewer dangling bonds and becomes more chemically stable, the insulating film 421 has a higher blocking effect. The insulating film 421 having an effect of blocking diffusion of oxygen, hydrogen, or water can be formed using, for example, aluminum oxide, aluminum oxynitride, gallium oxide, gallium oxynitride, yttrium oxide, yttrium oxynitride, hafnium oxide, hafnium oxynitride, or the like. The insulating film 421 having an effect of blocking diffusion of hydrogen or water can be formed using, for example, silicon nitride, silicon nitride oxide, or the like.

An insulating film 422 is provided over the insulating film 421. The transistor 75 is provided over the insulating film 422.

The transistor 75 includes, over the insulating film 422, a semiconductor film 430 including an oxide semiconductor; a conductive film 432 and a conductive film 433 that are electrically connected to the semiconductor film 430 and function as a source electrode or a drain electrode; a gate insulating film 431 covering the semiconductor film 430; and a gate electrode 434 overlapping with the semiconductor film 430 with the gate insulating film 431 positioned therebetween.

Although not clearly illustrated in FIG. 6, the transistor 75 is electrically connected to the transistor 70. Furthermore, the transistor 75 only needs to include at least the gate electrode 434 on one side of the semiconductor film 430, and may further include a gate electrode overlapping with the semiconductor film 430 with the insulating film 422 positioned therebetween.

In the case where the transistor 75 has a pair of gate electrodes, one of the gate electrodes may be supplied with a signal for controlling the on/off state, and the other of the gate electrodes may be supplied with a potential from another wiring. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In addition, FIG. 6 shows an example in which the transistor 75 has a single-gate structure where one channel formation region corresponding to one gate electrode 434 is provided. However, the transistor 75 may have a multi-gate structure where a plurality of electrically connected gate electrodes are provided so that a plurality of channel formation regions are included in one active layer.

Moreover, FIG. 6 shows an example in which the semiconductor film 430 of the transistor 75 includes an oxide semiconductor film 430a to an oxide semiconductor film 430c that are stacked in order over the insulating film 422. Note that in one embodiment of the present invention, the semiconductor film 430 of the transistor 75 may be formed using a single-layer metal oxide film.

The structures, methods, and the like in this embodiment can be used in appropriate combination with any of the structures, methods, and the like in the other embodiments.

Embodiment 4

In this embodiment, application examples of the semiconductor device described in the foregoing embodiments to an electronic component and to an electronic device including the electronic component will be described with reference to FIG. 10 and FIG. 11.

Figure 10A:
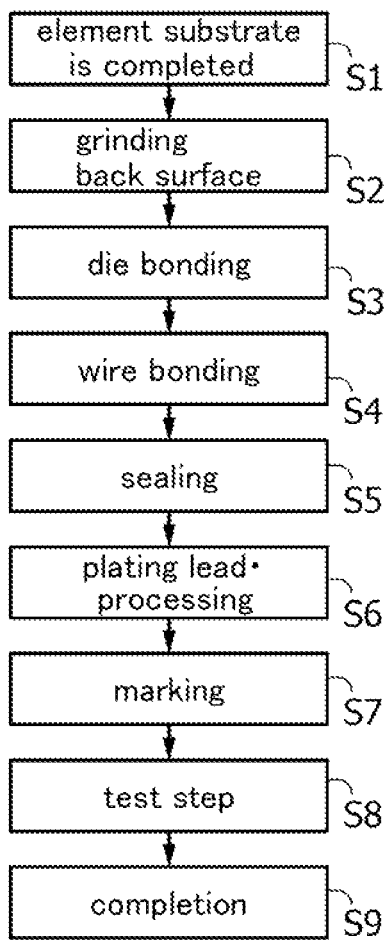
FIGS. 10A and 10B show a flowchart showing fabrication steps of a semiconductor device of one embodiment of the present invention and a perspective schematic view of the semiconductor device.

FIG. 10(A) shows an example where the semiconductor device described in the foregoing embodiments is used to make an electronic component. Note that an electronic component is also referred to as semiconductor package or IC package. For the electronic component, there are various standards and names corresponding to the direction of terminals or the shape of terminals; hence, one example of the electronic component will be described in this embodiment.

A semiconductor device including the aforementioned transistors shown in Embodiment 2 or 3 is completed by integrating detachable components on a printed circuit board through the assembly process (post-process).

The post-process can be completed through steps shown in FIG. 10(A). Specifically, after an element substrate obtained in the preceding process is completed (Step S1), a back surface of the substrate is ground (Step S2). The substrate is thinned in this step to reduce warpage or the like of the substrate in the preceding process and to reduce the size of the component itself.

The back surface of the substrate is ground and a dicing step for separating the substrate into a plurality of chips is performed. Then, a die bonding step is performed for individually picking up separate chips to be mounted on and bonded to a lead frame (Step S3). To bond a chip and a lead frame in the die bonding step, resin bonding, tape-automated bonding, or the like is selected as appropriate depending on products. Note that in the die bonding step, a chip may be mounted on and bonded to an interposer.

Next, wire bonding for electrically connecting a lead of the lead frame and an electrode on a chip through a metal wire is performed (Step S4). As the metal wire, a silver wire or a gold wire can be used. Further, for wire bonding, ball bonding or wedge bonding can be employed.

A wire-bonded chip is subjected to a molding step of sealing the chip with an epoxy resin or the like (Step S5). With the molding step, the inside of the electronic component is filled with a resin, which reduces damage to the circuit portion and the wire embedded in the component due to external mechanical force and reduces deterioration of characteristics due to moisture or dust.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed more accurately.

Next, printing process (marking) is performed on a surface of the package (Step S7). Then, through a final test step (Step S8), the electronic component is completed (Step S9).

The electronic component described above includes the semiconductor device described in the foregoing embodiments. It is thus possible to achieve the electronic component including the semiconductor device in which the frequency of malfunction in a high-temperature environment is reduced and manufacturing cost is reduced. Because the electronic component includes the semiconductor device in which the frequency of malfunction in a high-temperature environment is reduced and manufacturing cost is reduced, limit of the electronic component on a usage environment is relieved and the size thereof is reduced.

Figure 10B:
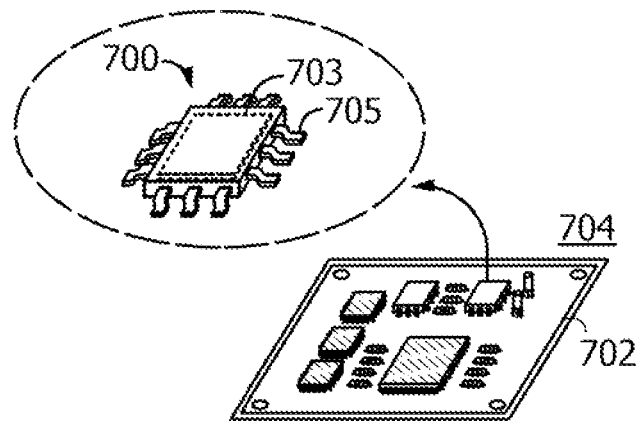

FIG. 10(B) is a perspective schematic diagram of a completed electronic component. FIG. 10(B) shows a perspective schematic diagram of a quad flat package (QFP) as an example of the electronic component. An electronic component 700 illustrated in FIG. 10(B) includes a lead 705 and a semiconductor device 703. The electronic component 700 in FIG. 10(B) is, for example, mounted on a printed board 702. A plurality of electronic components 700 are used in combination and electrically connected to each other over the printed board 702; thus, a substrate on which the electronic components are mounted (a mounted board 704) is completed. The completed mounted board 704 is provided in an electronic device or the like.

Next, with reference to FIG. 11, description is made on application examples of the aforementioned electronic components to a driver circuit for driving an inverter, a motor, or the like, which is provided in a vehicle that is driven with power from a fixed power supply (a bicycle or the like).

Figure 11A:
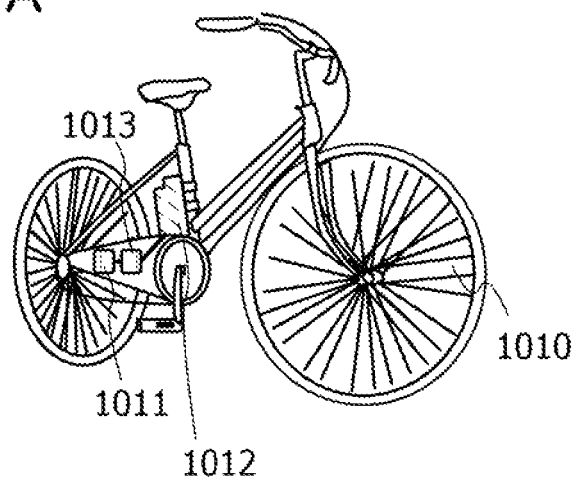
FIGS. 11A and 11B show electronic devices using a semiconductor device of one embodiment of the present invention.

FIG. 11(A) illustrates an electric bicycle 1010 as an application example. The electric bicycle 1010 obtains power when current is fed through a motor unit 1011. The electric bicycle 1010 includes a battery 1012 for supplying current fed through the motor unit 1011 and a driver circuit 1013 for driving the motor unit 1011. Note that pedals in FIG. 11(A) may be omitted.

A mounted board provided with an electronic component including the semiconductor device described in the foregoing embodiments is incorporated in the driver circuit 1013. Therefore, an electric bicycle provided with an electronic component whose limit on a usage environment is relieved and whose size is reduced is obtained.

Figure 11B:
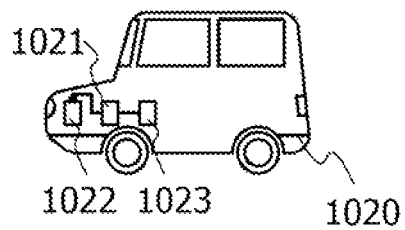

FIG. 11(B) illustrates an electric car 1020 as another application example. The electric car 1020 obtains power when current is fed through a motor unit 1021. The electric car 1020 includes a battery 1022 for supplying current fed through the motor unit 1021 and a driver circuit 1023 for driving the motor unit.

A mounted board provided with an electronic component including the semiconductor device described in the foregoing embodiments is incorporated in the driver circuit 1023. Therefore, an electric car provided with an electronic component whose limit on a usage environment is relieved and whose size is reduced is obtained.

As described above, the electronic device shown in this embodiment incorporates a mounted board provided with an electronic component including the semiconductor device described in any of the foregoing embodiments, thereby relieving limit of the electronic device on a usage environment and reducing the size thereof.

This application is based on Japanese Patent Application serial No. 2014-043759 filed with Japan Patent Office on Mar. 6, 2014, the entire contents of which are hereby incorporated by reference.

DESCRIPTION OF REFERENCE NUMERALS 70 transistor
75 transistor
90 transistor
90B transistor
91 insulating film
92a oxide semiconductor film
92b oxide semiconductor film
92c oxide semiconductor film
93 conductive film
94 conductive film
95 insulating film
96 conductive film
96b conductive film
97 substrate
100 semiconductor device
101 buffer circuit
102 level shift circuit
103 flip-flop circuit
104 buffer circuit
105 buffer circuit
107 pulse generation circuit
111 resistor
112 resistor
113 transistor
114 transistor
121 transistor
122 transistor
131 transistor
132 transistor
133 transistor
134 transistor
135 transistor
136 transistor
142 inverter circuit
150 semiconductor device
160 semiconductor device
201 buffer circuit
202 buffer circuit
221 transistor
222 transistor
300 semiconductor device
400 substrate
401 element separation region
402 impurity region
403 impurity region
404 channel formation region
405 insulating film
406 gate electrode
411 insulating film
412 conductive film
413 conductive film
414 conductive film
416 conductive film
417 conductive film
418 conductive film
420 insulating film
421 insulating film
422 insulating film
430 semiconductor film
430a oxide semiconductor film
430c oxide semiconductor film
431 gate insulating film
432 conductive film
433 conductive film
434 gate electrode
601 semiconductor substrate
610 transistor
602 element separation region
611 insulating film
612 insulating film
613 insulating film
614 insulating film
615 insulating film
620 transistor
625a conductive film
625b conductive film
625c conductive film
625d conductive film
630 transistor
634a conductive film
634b conductive film
634c conductive film
640 conductive film
642 conductive film 644 conductive film
662 gate insulating film
700 electronic component
701 semiconductor film
702 printed board
703 semiconductor device
704 mounted board
705 lead
710 region
711 region
721 conductive film
722 conductive film
731 gate electrode
732 insulating film
1010 electric bicycle
1011 motor unit
1012 battery
1013 driver circuit
1020 electric car
1021 motor unit
1022 battery
1023 driver circuit

What is claimed is:

1. A semiconductor device comprising a first circuit, a second circuit, a third circuit, and a fourth circuit,
    wherein the first circuit has a function of converting a first signal into a second signal and outputting the second signal,
    wherein the second circuit has a function of converting the second signal into a third signal and outputting the third signal,
    wherein the third circuit has a function of outputting a fourth signal based on the third signal,
    wherein the fourth circuit has a function of outputting a first potential or a second potential in accordance with the fourth signal,
    wherein the second circuit comprises a first transistor, a second transistor, a first resistor, and a second resistor,
    wherein one of a source and a drain of the first transistor is electrically connected to one terminal of the first resistor,
    wherein one of a source and a drain of the second transistor is electrically connected to one terminal of the second resistor,
    wherein a channel of the first transistor includes an oxide semiconductor, and
    wherein a channel of the second transistor includes an oxide semiconductor.

2. A semiconductor device comprising a first circuit, a second circuit, a third circuit, and a fourth circuit,
    wherein the first circuit has a function of converting a first signal into a second signal and outputting the second signal,
    wherein the second circuit has a function of converting the second signal into a third signal and outputting the third signal,
    wherein the third circuit has a function of outputting a fourth signal based on the third signal,
    wherein the fourth circuit has a function of outputting a first potential or a second potential in accordance with the fourth signal,
    wherein the second circuit comprises a first transistor, a second transistor, a first resistor, and a second resistor,
    wherein the fourth circuit comprises a third transistor and a fourth transistor,
    wherein one of a source and a drain of the first transistor is electrically connected to one terminal of the first resistor,
    wherein one of a source and a drain of the second transistor is electrically connected to one terminal of the second resistor,
    wherein the other terminal of the first resistor is electrically connected to a first wiring,
    wherein the other terminal of the second resistor is electrically connected to the first wiring,
    wherein a gate of the third transistor is electrically connected to the third circuit,
    wherein one of a source and a drain of the third transistor is electrically connected to one of a source and a drain of the fourth transistor,
    wherein the other of the source and the drain of the third transistor is electrically connected to the first wiring,
    wherein a gate of the fourth transistor is electrically connected to the third circuit,
    wherein the other of the source and the drain of the fourth transistor is electrically connected to a second wiring,
    wherein a channel of the first transistor includes an oxide semiconductor,
    wherein a channel of the second transistor includes an oxide semiconductor,
    wherein a channel of the third transistor includes silicon, and
    wherein a channel of the fourth transistor includes silicon.

3. The semiconductor device according to claim 2,
    wherein an insulating film is positioned over the third transistor and the fourth transistor, and
    wherein the first transistor and the second transistor are positioned over the insulating film.

4. The semiconductor device according to claim 1 or 2,
    wherein the second signal has a higher potential than the first signal, and
    wherein the third signal has a higher potential than the second signal.

5. The semiconductor device according to claim 1 or 2, comprising a fifth circuit,
    wherein the fifth circuit that has a function of converting the fourth signal into a fifth signal having a higher potential than the fourth signal and outputting the fifth signal to the fourth circuit.

6. The semiconductor device according to claim 1 or 2,
    wherein the channel of the first transistor includes indium, gallium, and zinc, and
    wherein the channel of the second transistor includes indium, gallium, and zinc.

* * * * *